(12) United States Patent
Los

(10) Patent No.: US 11,431,197 B2
(45) Date of Patent: Aug. 30, 2022

(54) SYSTEMS AND METHODS FOR UTILIZING LASER CUTTING AND CHEMICAL ETCHING IN MANUFACTURING WIRELESS POWER ANTENNAS

(71) Applicant: NuCurrent, Inc., Chicago, IL (US)

(72) Inventor: Oleg Los, Buffalo Grove, IL (US)

(73) Assignee: NuCurrent, Inc., Chicago, IL (US)

( * ) Notice: Subject to any disclaimer, the term of this patent is extended or adjusted under 35 U.S.C. 154(b) by 0 days.

(21) Appl. No.: 17/135,029

(22) Filed: Dec. 28, 2020

(65) Prior Publication Data

US 2022/0209576 A1 Jun. 30, 2022

(51) Int. Cl.
| | |
|---|---|
| H02J 50/00 | (2016.01) |
| H02J 50/12 | (2016.01) |
| H05K 3/00 | (2006.01) |
| H05K 1/16 | (2006.01) |
| B23K 26/38 | (2014.01) |

(52) U.S. Cl.
CPC ............ *H02J 50/005* (2020.01); *B23K 26/38* (2013.01); *H02J 50/12* (2016.02); *H05K 1/165* (2013.01); *H05K 3/002* (2013.01); *H05K 3/0026* (2013.01); *H05K 2201/10098* (2013.01)

(58) Field of Classification Search
None
See application file for complete search history.

(56) References Cited

U.S. PATENT DOCUMENTS

| | | | | |
|---|---|---|---|---|
| 4,959,119 A | * | 9/1990 | Lantzer | B23K 26/382 257/E21.255 |
| 10,103,113 B2 | * | 10/2018 | Ko | H05K 3/0073 |
| 2002/0028293 A1 | * | 3/2002 | Yang | H05K 3/002 427/443.1 |
| 2011/0275315 A1 | * | 11/2011 | Dembo | G01R 29/0857 455/41.1 |
| 2014/0041923 A1 | | 2/2014 | Hisada et al. | |

(Continued)

FOREIGN PATENT DOCUMENTS

KR 20200045604 A 5/2020

OTHER PUBLICATIONS

International Searching Authority, PCT International Search Report and Written Opinion, PCT International Application No. PCT/US2021/065384 dated Apr. 25, 2022, 10 pages.

*Primary Examiner* — Jared Fureman
*Assistant Examiner* — Joel Barnett
(74) *Attorney, Agent, or Firm* — Lee Sullivan Shea & Smith LLP

(57) ABSTRACT

A PCB for wireless power transfer includes an antenna and the antenna includes a coil. A method for manufacturing the PCB includes providing a prefabricated PCB, the prefabricated PCB including a PCB design and a first area and providing a first sheet of a conductive metal for the first area. The method includes applying an etch resistant coating on a coil area within the first area and laser cutting the first sheet within the coil area, based on a laser cutting path for a first plurality of turns for a first layer of the coil, the first geometry configured wireless power transfer. The method further includes substantially exposing the first sheet to an etching solution, the etching solution substantially removing first portions of the conductive metal from the substrate to define, at least, first turn gaps between at least two of the first plurality of turns.

20 Claims, 11 Drawing Sheets

(56) References Cited

U.S. PATENT DOCUMENTS

2014/0124474 A1 5/2014 You et al.
2015/0024523 A1 1/2015 Virtanen
2018/0006366 A1 1/2018 Hur et al.
2019/0165474 A1 5/2019 An et al.

* cited by examiner

SYSTEMS AND METHODS FOR UTILIZING LASER CUTTING AND CHEMICAL ETCHING IN MANUFACTURING WIRELESS POWER ANTENNAS

TECHNICAL FIELD

The present disclosure generally relates to systems and methods for manufacturing wireless power transfer antennas, and, more particularly, to systems and methods utilizing laser cutting and chemical etching to manufacture wireless power transfer antennas.

BACKGROUND

Wireless power transfer systems are used in a variety of applications for the wireless transfer of electrical energy, electrical power, electromagnetic energy, electrical data signals, among other known wirelessly transmittable signals. Such systems often use inductive wireless power transfer, which occurs when magnetic fields created by a transmitting element induce an electric field, and hence, an electric current, in a receiving element. These transmission and receiver elements will often take the form of coiled wires and/or antennas.

Antennas utilized in wireless power transfer systems, generally, comprise one or more turns of a conductive wire and/or trace. Such turns can be wire wound (e.g., physically winding a wire in a physical setting to create a form for the antenna coil) and, alternatively, such antenna coils can be printed, etched, and/or otherwise disposed on a circuit board or printed circuit board (PCB). In some examples of PCB antennas, the PCB antennas may be disposed on a flexible printed circuit board (PCB), which may be utilized for fitting the antenna into tight spaces in modern electronics.

PCB circuit boards can be effectively manufactured utilizing an etching process, where a sheet of conductive metal has a etch resistant coating disposed thereon in places that the manufacturer wants the antenna to lie. While PCB etching for wireless power transfer antennas can be relatively efficient and serves a need, in creating smaller sized antennas, the electronic characteristics of the antenna are limited to the precision of the etching process for achieving gap widths and turn widths for the antenna coils.

SUMMARY

New systems and methods for manufacturing PCBs, which include wireless power antennas, are desired, wherein a combination of laser cutting the conductive metal and chemical etching of the conductive metal are utilized to produce a wireless power transfer antenna with enhanced electrical characteristics, efficiency, and/or performance on a prefabricated PCB.

Transmission of one or more of electrical energy, electrical power, electromagnetic energy and electronic data signals from one of such coiled antennas to another, generally, operates at an operating frequency and/or an operating frequency range. The operating frequency may be selected for a variety of reasons, such as, but not limited to, power transfer characteristics, power level characteristics, self-resonant frequency restraints, design requirements, adherence to standards bodies' required characteristics, bill of materials (BOM) and/or form factor constraints, among other things. It is to be noted that, "self-resonating frequency," as known to those having skill in the art, generally refers to the resonant frequency of an inductor due to the parasitic characteristics of the component.

Utilizing the systems and methods disclosed herein, the manufactured antennas may allow for the ability to manufacture higher efficiency and/or quality factor (Q) antennas for wireless power transfer, due to one or more of decrease in gap width, increases in turn width, or increases in number of turns within a given area. Experimental results have shown that, when using the systems and methods disclosed herein, beneficial, narrow gap widths, which result in the benefits discussed above, are achieved at various thicknesses of copper for the metal sheets, such as a gap of about 50 microns when the copper is about half-ounce copper, a gap of about 75 microns when the copper is about one-ounce copper, a gap of about 100 microns when the copper is two-ounce copper, and a gap of about 125 microns when the copper is three-ounce copper. Such narrow gap widths may allow for the performance benefits and/or electrical characteristics, discussed above.

In some example experimental results wherein two ounce copper was used for the sheets of metal that were cut and etched to form the conductive layer(s), utilizing the systems and methods disclosed herein, it was found that the processes could consistently achieve gap widths of about 90-100 microns between turns of the conductive layer(s). Power characteristic test measurements were performed on the experimental test results of the systems and methods disclosed herein and antennas were produced having at least about a 10 percent to 15 percent improvement in one or both of quality factor (Q) or equivalent series resistance (ESR) in the antenna, when compared to a comparable antenna, manufactured via known, conventional means for producing a PCB antenna. Further, it was found that improvements in efficiency, Q, and ESR were more pronounced in antennas configured for operation at lower operating frequencies, such as those in a range of about 87 kHz to about 205 kHz.

Further, in addition to performance benefits achieved via the systems and methods disclosed herein, the utilization of the combination of laser cutting and chemical etching results in a decrease in time spent manufacturing the antennas, in comparison to manufacturing legacy antennas. Additionally, the systems and methods disclosed herein can provide for both faster and more cost-effective manufacturing, by utilizing the laser cutting and chemical etching combination, to accelerate the speed of production of said antennas 21, 31.

In accordance with one aspect of the disclosure, a method for manufacturing a printed circuit board (PCB) for a wireless power transfer system is disclosed. The PCB includes an antenna and the antenna includes a coil. The method includes providing a prefabricated PCB, the prefabricated PCB including a PCB design and a first area. The method includes providing a first sheet of a conductive metal, the first sheet including the first area. The method further includes applying an etch resistant coating on a coil area within the first area. The method further includes laser cutting the first sheet within the coil area, based on a laser cutting path, the laser cutting path defining a first geometry for a first plurality of turns for a first layer of the coil, the first geometry configured for one or more of transmission of wireless power signals, receipt of wireless power signals, and combinations thereof. The method further includes substantially exposing the first sheet to an etching solution, the etching solution substantially removing first portions of the conductive metal from the substrate to define, at least, first turn gaps between at least two of the first plurality of turns.

In a refinement, the method further includes determining the coil area based, at least, on an exterior geometry for the first coil layer.

In a refinement, the method further includes determining the laser cutting path based, at least, on one or more of the first geometry, a number of turns for the plurality of turns, and any combinations thereof.

In a refinement, the PCB design includes one or more of at least one trace, at least one via, or combinations thereof.

In a further refinement, the method further includes providing a pressure sensitive adhesive in between the first sheet and the substrate and affixing the sheet to the substrate includes affixing the first sheet to the substrate via the pressure sensitive adhesive.

In another further refinement, the method further includes providing a coverlay substantially covering the first coil layer and the substrate.

In a refinement, the method further includes providing a second sheet of a conductive metal, the second sheet defining a second area, applying an etch resistant coating on a second coil area within the second area, laser cutting the second sheet within the coil area, based on a second laser cutting path, the second laser cutting path defining a second geometry of turns for a second layer of the coil, the second geometry configured for one or more of transmission of wireless power signals, receipt of wireless power signals, and combinations thereof, and substantially exposing the second sheet to an etching solution, the etching solution substantially removing second portions of the conductive metal, the second portions positioned to define, at least, turn gaps between at least two of the second plurality of turns.

In a refinement, the conductive metal is copper.

In a further refinement, the conductive metal is two-ounce copper and wherein the geometry defines at least one gap between two of the plurality of turns is less than about 140 microns.

In another further refinement, the conductive metal is three-ounce copper and wherein the geometry defines at least one gap between two of the plurality of turns is less than about 150 microns.

In accordance with another aspect of the disclosure, a method for manufacturing a printed circuit board (PCB) for a wireless power transfer system is disclosed. The PCB includes an antenna and the antenna includes a multi-layered coil having, at least, a first layer and a second layer. The method includes providing a prefabricated PCB, the prefabricated PCB including a PCB design, a first area, and a second area. The method further includes providing a first sheet of a conductive metal, the first sheet including the first area and providing a second sheet of a conductive metal, the second sheet defining a second area. The method includes applying an etch resistant coating on a first coil area within the first area and applying an etch resistant coating on a second coil area within the second area. The method further includes laser cutting the first sheet within the first coil area, based on a first laser cutting path, the first laser cutting path defining a first geometry for a first plurality of turns for a first layer of the coil, the first geometry configured for one or more of transmission of wireless power signals, receipt of wireless power signals, and combinations thereof. The method further includes laser cutting the second sheet within the second coil area, based on a second laser cutting path, the second laser cutting path defining a second geometry for a second plurality of turns for a second layer of the coil, the second geometry configured for one or more of transmission of wireless power signals, receipt of wireless power signals, and combinations thereof. The method further includes substantially exposing the first sheet to an etching solution, the etching solution substantially removing first portions of the conductive metal from the substrate to define, at least, first turn gaps between at least two of the first plurality of turns. The method further includes substantially exposing the second sheet to an etching solution, the etching solution substantially removing second portions of the conductive metal from the substrate to define, at least, second turn gaps between at least two of the second plurality of turns.

In a refinement, the method further includes welding the first layer of the coil to the second layer of the coil.

In a further refinement, welding the first layer of the coil to the second layer of the coil includes spot welding the first layer of the coil to the second layer of the coil at a mutual connection point.

In an even further refinement, the via is configured to connect the first layer of the coil to the second layer of the coil in a parallel electrical connection.

In a refinement, the method further includes affixing the first sheet to a top face of a substrate and affixing the second sheet to a bottom face of the substrate.

In a further refinement, the method further includes providing a first pressure sensitive adhesive in between the first layer and the top face of the substrate and providing a second pressure sensitive adhesive in between the second layer and the bottom face of the substrate, wherein affixing the first layer to the substrate includes affixing the first layer to the top face of the substrate via the first pressure sensitive adhesive, and wherein affixing the second layer to the substrate includes affixing the second layer to the bottom face of the substrate via the second pressure sensitive adhesive.

In an even further refinement, providing the first pressure sensitive adhesive includes providing a first cutout in the first pressure sensitive adhesive and providing the second pressure sensitive adhesive includes providing a second cutout in the first pressure sensitive adhesive, and the first and second cutouts are configured at a location for a spot weld between the first sheet and the second sheet.

In an even further refinement, the method further includes spot welding the first sheet and the second sheet at a location proximate to the first and second cutouts.

In yet another aspect of the disclosure, a PCB for a wireless power transfer system is disclosed. The PCB includes a coil, the coil including a first layer, wherein the first layer defines a first plurality of turns, the first plurality of turns formed by providing a prefabricated PCB, the prefabricated PCB including a PCB design and a first area, providing a first sheet of a conductive metal, the first sheet including the first area, applying an etch resistant coating on a coil area within the first area, laser cutting the first sheet within the coil area, based on a laser cutting path, the laser cutting path defining a first geometry for the plurality of turns for the first layer of the coil, the first geometry configured for one or more of transmission of wireless power signals, receipt of wireless power signals, and combinations thereof, and substantially exposing the first sheet to an etching solution, the etching solution substantially removing first portions of the conductive metal from the substrate to define, at least, first turn gaps between at least two of the first plurality of turns.

In a refinement, the coil further includes a second layer, the second layer defining a second plurality of turns, the second plurality of turns formed by providing a second sheet of a conductive metal, the second sheet defining a second area, applying an etch resistant coating on a second coil area within the second area, laser cutting the second sheet within the second coil area, based on a laser cutting path, the laser cutting path defining a second geometry for the second plurality of turns for the second layer of the coil, the second geometry configured for one or more of transmission of wireless power signals, receipt of wireless power signals, and combinations thereof, substantially exposing the second sheet to an etching solution, the etching solution substantially removing second portions of the conductive metal from the substrate to define, at least, second turn gaps between at least two of the second plurality of turns, wherein the first layer is affixed to a top face of the substrate, and wherein the second layer is affixed to a bottom face of the substrate.

These and other aspects and features of the present disclosure will be better understood when read in conjunction with the accompanying drawings.

BRIEF DESCRIPTION OF THE DRAWINGS

FIG. 9 is a zoomed in image of exemplary layers of conductive metal of an antenna, after both the laser cutting and chemical etching steps of the systems and methods disclosed herein, in accordance with FIGS. 1-8 and the present disclosure.

While the following detailed description will be given with respect to certain illustrative embodiments, it should be understood that the drawings are not necessarily to scale and the disclosed embodiments are sometimes illustrated diagrammatically and in partial views. In addition, in certain instances, details which are not necessary for an understanding of the disclosed subject matter or which render other details too difficult to perceive may have been omitted. It should therefore be understood that this disclosure is not limited to the particular embodiments disclosed and illustrated herein, but rather to a fair reading of the entire disclosure and claims, as well as any equivalents thereto. Additional, different, or fewer components and methods may be included in the systems and methods.

DETAILED DESCRIPTION

In the following description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Figure 1:
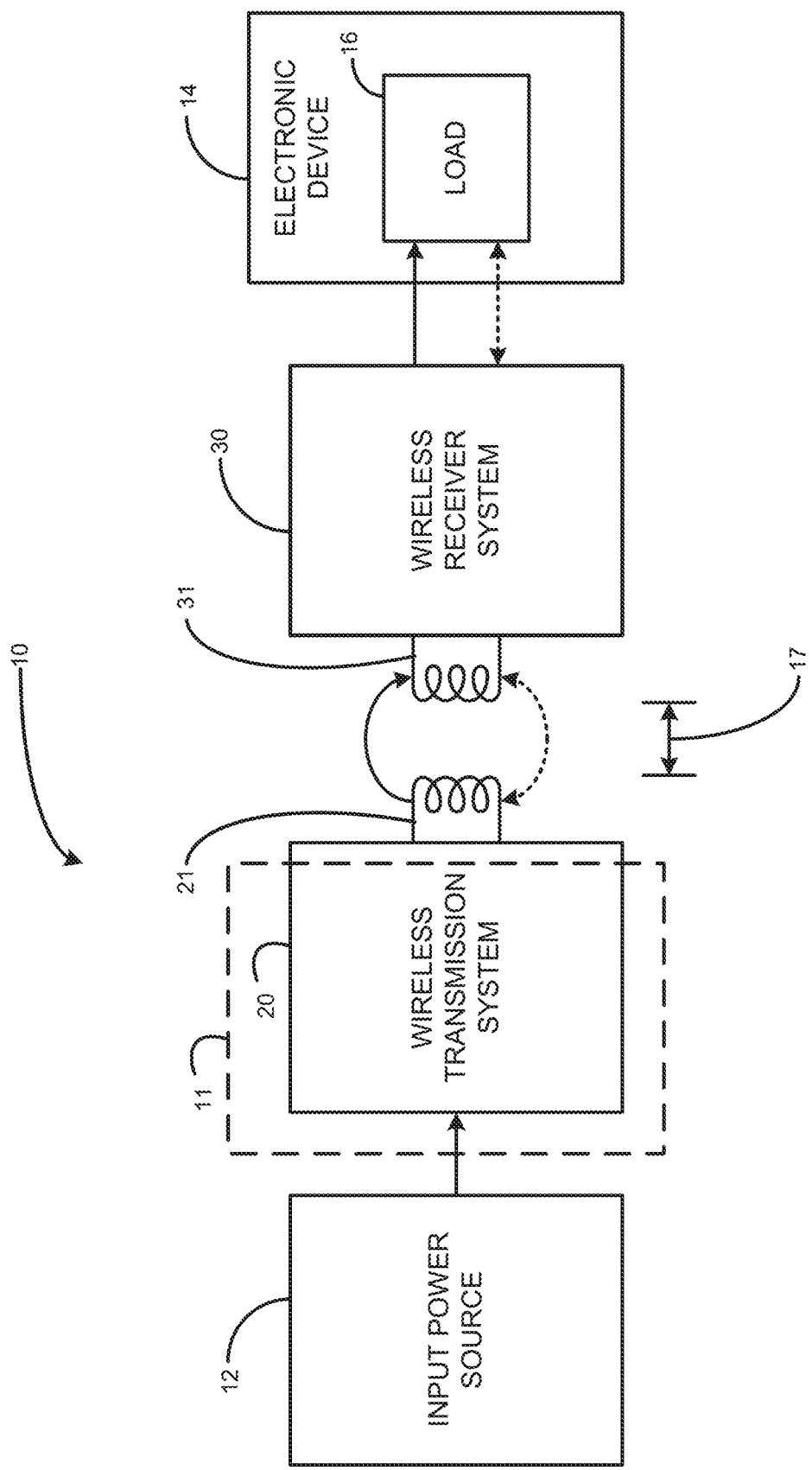
FIG. 1 is a block diagram of an embodiment of a system for wirelessly transferring one or more of electrical energy, electrical power, electromagnetic energy electronic data, and combinations thereof, in accordance with the present disclosure.

Referring now to the drawings and with specific reference to FIG. 1, a wireless power transfer system 10 is illustrated. The wireless power transfer system 10 provides for the wireless transmission of electrical signals, such as, but not limited to, electrical energy, electrical power, electrical power signals, electromagnetic energy, and electronically transmittable data ("electronic data"). Specifically, the wireless power transfer 10 provides for the wireless transmission of electrical signals via near field magnetic coupling. As shown in the embodiment of FIG. 1, the wireless power transfer 10 includes a wireless transmission system 20 and a wireless receiver system 30. The wireless receiver system is configured to receive electrical energy, electrical power, electromagnetic energy, electrical power signals, and/or electronic data from, at least, the wireless transmission system 20.

As illustrated, the wireless transmission system 20 and wireless receiver system 30 may be configured to transmit electrical energy, electrical power, electromagnetic energy, electrical power signals, and/or electronically transmittable data across, at least, a separation distance or gap 17. A separation distance or gap, such as the gap 17, in the context of a wireless power transfer systems, such as the system 10, does not include a physical connection, such as a wired connection. There may be intermediary objects located in a separation distance or gap, such as the gap 17, such as, but not limited to, air, a counter top, a casing for an electronic device, a plastic filament, an insulator, a mechanical wall, among other things; however, there is no physical, electrical connection at such a separation distance or gap.

Thus, the combination of the wireless transmission system 20 and the wireless receiver system 30 create an electrical connection without the need for a physical connection. "Electrical connection," as defined herein, refers to any facilitation of a transfer of an electrical current, voltage, and/or power from a first location, device, component, and/or source to a second location, device, component, and/or destination. An "electrical connection" may be a physical connection, such as, but not limited to, a wire, a trace, a via, among other physical electrical connections, connecting a first location, device, component, and/or source to a second location, device, component, and/or destination. Additionally or alternatively, an "electrical connection" may be a wireless electrical connection, such as, but not limited to, magnetic, electromagnetic, resonant, and/or inductive field, among other wireless electrical connections, connecting a first location, device, component, and/or source to a second location, device, component, and/or destination.

Alternatively, the gap 17 may be referenced as a "Z-Distance," because, if one considers an antenna 21, 31 to be disposed substantially along a common X-Y plane, then the distance separating the antennas 21, 31 is the gap in a "Z" or "depth" direction. However, flexible and/or non-planar coils are certainly contemplated by embodiments of the present disclosure and, thus, it is contemplated that the gap 17 may not be uniform, across an envelope of connection distances between the antennas 21,31. It is contemplated that various tunings, configurations, and/or other parameters may alter the possible maximum distance of the gap 17, such that electrical transmission from the wireless transmission system 20 to the wireless receiver system 30 remains possible.

The wireless power system 10 operates when the wireless transmission system 20 and the wireless receiver system 30 are coupled. As defined herein, the terms "couples," "coupled," and "coupling" generally refers to magnetic field coupling, which occurs when the energy of a transmitter and/or any components thereof and the energy of a receiver and/or any components thereof are coupled to each other through a magnetic field. Coupling of the wireless transmission system 20 and the wireless receiver system 30, in the system 10, may be represented by a resonant coupling coefficient of the system 10 and, for the purposes of wireless power transfer, the coupling coefficient for the system 10 may be in the range of about 0.01 and 0.9.

As illustrated, the wireless transmission system 20 may be associated with a host device 11, which may receive power from an input power source 12. The host device 11 may be any electrically operated device, circuit board, electronic assembly, dedicated charging device, or any other contemplated electronic device. Example host devices 11, with which the wireless transmission system 20 may be associated therewith, include, but are not limited to including, a device that includes an integrated circuit, cases for wearable electronic devices, receptacles for electronic devices, a portable computing device, clothing configured with electronics, storage medium for electronic devices, charging apparatus for one or multiple electronic devices, dedicated electrical charging devices, activity or sport related equipment, goods, and/or data collection devices, among other contemplated electronic devices.

As illustrated, one or both of the wireless transmission system 20 and the host device 11 are operatively associated with an input power source 12. The input power source 12 may be or may include one or more electrical storage devices, such as an electrochemical cell, a battery pack, and/or a capacitor, among other storage devices. Additionally or alternatively, the input power source 12 may be any electrical input source (e.g., any alternating current (AC) or direct current (DC) delivery port) and may include connection apparatus from said electrical input source to the wireless transmission system 20 (e.g., transformers, regulators, conductive conduits, traces, wires, or equipment, goods, computer, camera, mobile phone, and/or other electrical device connection ports and/or adaptors, such as but not limited to USB or mp3 ports and/or adaptors, among other contemplated electrical components).

Electrical energy received by the wireless transmission system 20 is then used for at least two purposes: providing electrical power to internal components of the wireless transmission system 20 and providing electrical power to the transmitter antenna 21. The transmitter antenna 21 is configured to wirelessly transmit the electrical signals conditioned and modified for wireless transmission by the wireless transmission system 20 via near-field magnetic coupling (NFMC). Near-field magnetic coupling enables the transfer of electrical energy, electrical power, electromagnetic energy, and/or electronically transmissible data wirelessly through magnetic induction between the transmitter antenna 21 and a receiving antenna 31 of, or associated with, the wireless receiver system 30. Near-field magnetic coupling may enable "inductive coupling," which, as defined herein, is a wireless power transmission technique that utilizes an alternating electromagnetic field to transfer electrical energy between two antennas. Such inductive coupling is the near field wireless transmission of electrical energy between two magnetically coupled coils that are tuned to resonate at a similar frequency. Further, such near-field magnetic coupling may provide connection via "mutual inductance," which, as defined herein is the production of an electromotive force in a circuit by a change in current in a second circuit magnetically coupled to the first.

In one or more embodiments, the inductor coils of either the transmitter antenna 21 or the receiver antenna 31 are strategically positioned to facilitate reception and/or transmission of wirelessly transferred electrical energy, power, electromagnetic energy and/or data through near field magnetic induction. Antenna operating frequencies may comprise all operating frequency ranges, examples of which may include, but are not limited to, about 87 kHz to about 205 kHz (Qi interface standard), 100 kHz to about 350 kHz (PMA interface standard), 6.78 MHz (Rezence interface standard and/or any other proprietary interface standard operating at a frequency of 6.78 MHz), 13.56 MHz (Near Field Communications (NFC) standard, defined by ISO/IEC standard 18092), 27 MHz and/or, alternatively, at an operating frequency of another proprietary operating mode. The operating frequencies of the antennas 21, 31 may be operating frequencies designated by the International Telecommunications Union (ITU) in the Industrial, Scientific, and Medical (ISM) frequency bands, which include, but are not limited to including, 6.78 MHz, 13.56 MHz, and 27 MHz, which are designated for use in wireless power transfer.

In addition, the transmitting antenna and/or the receiving antenna of the present disclosure may be designed to transmit or receive, respectively, over a wide range of operating frequencies on the order of about 1 kHz to about 1 GHz or greater, in addition to the Qi, PMA, Rezence, and NFC interface standards. The transmitting antenna and the receiving antenna of the present disclosure may be configured to transmit and/or receive electrical power having a magnitude that ranges from about 10 mW to about 500 W. In one or more embodiments the inductor coil of the transmitting antenna 21 is configured to resonate at a transmitting antenna resonant frequency or within a transmitting antenna resonant frequency band.

As known to those skilled in the art, a "resonant frequency" or "resonant frequency band" refers a frequency or frequencies wherein amplitude response of the antenna is at a relative maximum, or, additionally or alternatively, the frequency or frequency band where the capacitive reactance has a magnitude substantially similar to the magnitude of the inductive reactance. In one or more embodiments the transmitting antenna resonant frequency is at least 1 kHz. In one or more embodiments the transmitting antenna resonant frequency band extends from about 1 kHz to about 100 MHz. In one or more embodiments the inductor coil of the receiving antenna 31 is configured to resonate at a receiving antenna resonant frequency or within a receiving antenna resonant frequency band. In one or more embodiments the receiving antenna resonant frequency is at least 1 kHz. In one or more embodiments the receiving antenna resonant frequency band extends from about 1 kHz to about 100 MHz.

The wireless receiver system 30 may be associated with at least one electronic device 14, wherein the electronic device 14 may be any device that requires electrical power for any function and/or for power storage (e.g., via a battery and/or capacitor). Additionally or alternatively, the electronic device 14 may be any device capable of receipt of electronically transmissible data. For example, the device may be, but is not limited to being, a handheld computing device, a mobile device, a portable appliance, an integrated circuit, an identifiable tag, a kitchen utility device, an electronic tool, an electric vehicle, a game console, a robotic device, a wearable electronic device (e.g., an electronic watch, electronically modified glasses, altered-reality (AR) glasses, virtual reality (VR) glasses, among other things), a portable scanning device, a portable identifying device, a sporting good, an embedded sensor, an Internet of Things (IoT) sensor, IoT enabled clothing, IoT enabled recreational equipment, industrial equipment, medical equipment, a medical device a tablet computing device, a portable control device, a remote controller for an electronic device, a gaming controller, among other things.

For the purposes of illustrating the features and characteristics of the disclosed embodiments, arrow-ended lines are utilized to illustrate transferrable and/or communicative signals and various patterns are used to illustrate electrical signals that are intended for power transmission and electrical signals that are intended for the transmission of data and/or control instructions. Solid lines indicate signal transmission of electrical energy over a physical and/or wireless electrical connection, in the form of power signals that are, ultimately, utilized in wireless power transmission from the wireless transmission system 20 to the wireless receiver system 30. Further, dotted lines are utilized to illustrate electronically transmittable data signals, which ultimately may be wirelessly transmitted from the wireless transmission system 20 to the wireless receiver system 30.

While the systems and methods herein illustrate the transmission of wirelessly transmitted energy, wirelessly transmitted power, wirelessly transmitted electromagnetic energy, and electronically transmittable data, it is certainly contemplated that the systems, methods, and apparatus disclosed herein may be utilized in the transmission of only one signal, various combinations of two signals, or more than two signals and, further, it is contemplated that the systems, method, and apparatus disclosed herein may be utilized for wireless transmission of other electrical signals in addition to or uniquely in combination with one or more of the above mentioned signals. In some examples, the signal paths of solid or dotted lines may represent a functional signal path, whereas, in practical application, the actual signal is routed through additional components en route to its indicated destination. For example, it may be indicated that a data signal routes from a communications apparatus to another communications apparatus; however, in practical application, the data signal may be routed through an amplifier, then through a transmission antenna, to a receiver antenna, where, on the receiver end, the data signal is decoded by a respective communications device of the receiver.

Figure 2:
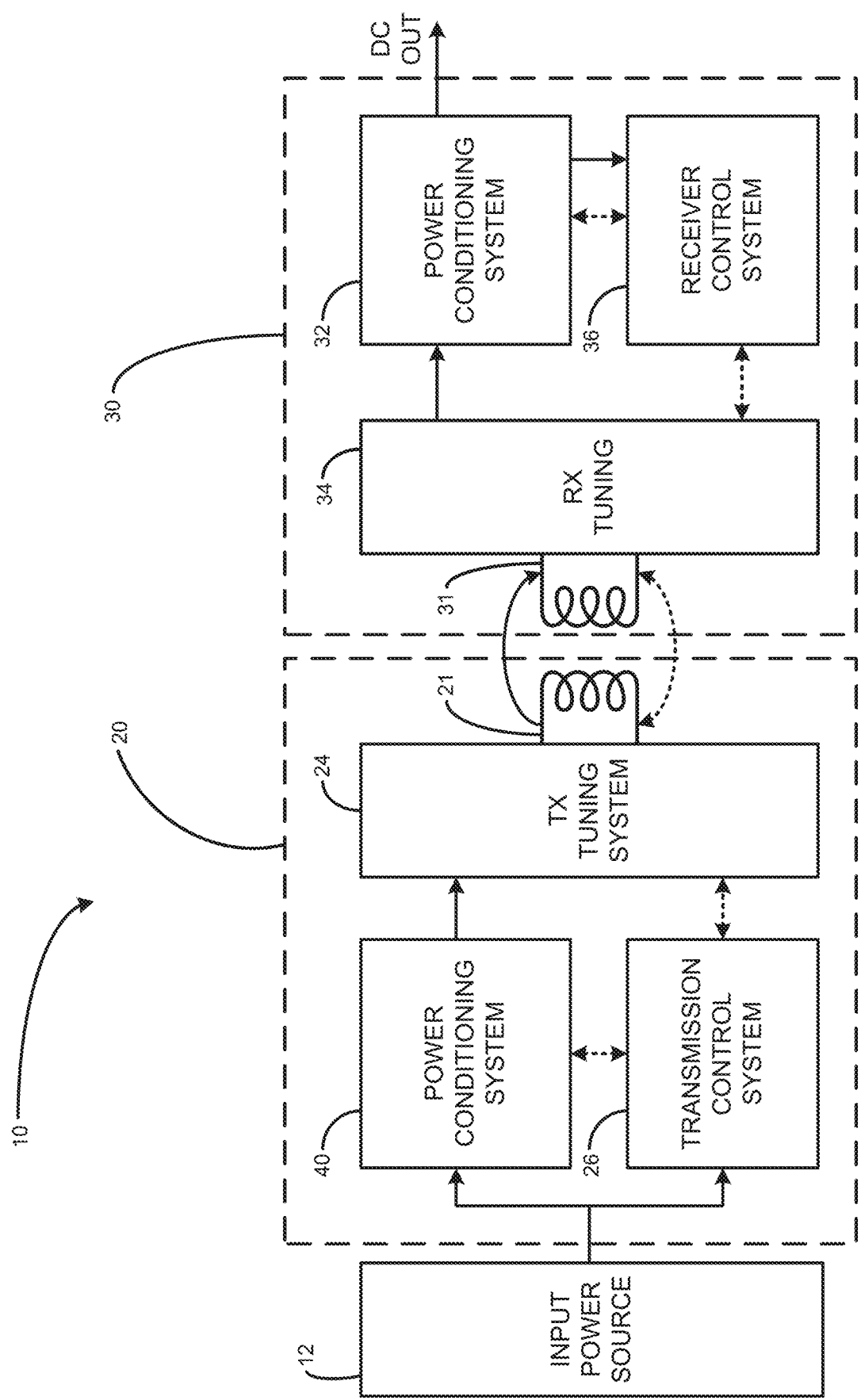
FIG. 2 is a block diagram illustrating components of a wireless transmission system of the system of FIG. 1 and a wireless receiver system of the system of FIG. 1, in accordance with FIG. 1 and the present disclosure.

Turning now to FIG. 2, the wireless power transfer 10 is illustrated as a block diagram including example sub-systems of both the wireless transmission system 20 and the wireless receiver system 30. The wireless transmission system 20 may include, at least, a power conditioning system 40, a transmission control system 26, a transmission tuning system 24, and the transmission antenna 21. A first portion of the electrical energy input from the input power source 12 is configured to electrically power components of the wireless transmission system 20 such as, but not limited to, the transmission control system 26. A second portion of the electrical energy input from the input power source 12 is conditioned and/or modified for wireless power transmission, to the wireless receiver system 30, via the transmission antenna 21. Accordingly, the second portion of the input energy is modified and/or conditioned by the power conditioning system 40. While not illustrated, it is certainly contemplated that one or both of the first and second portions of the input electrical energy may be modified, conditioned, altered, and/or otherwise changed prior to receipt by the power conditioning system 40 and/or transmission control system 26, by further contemplated subsystems (e.g., a voltage regulator, a current regulator, switching systems, fault systems, safety regulators, among other things).

Figure 3:
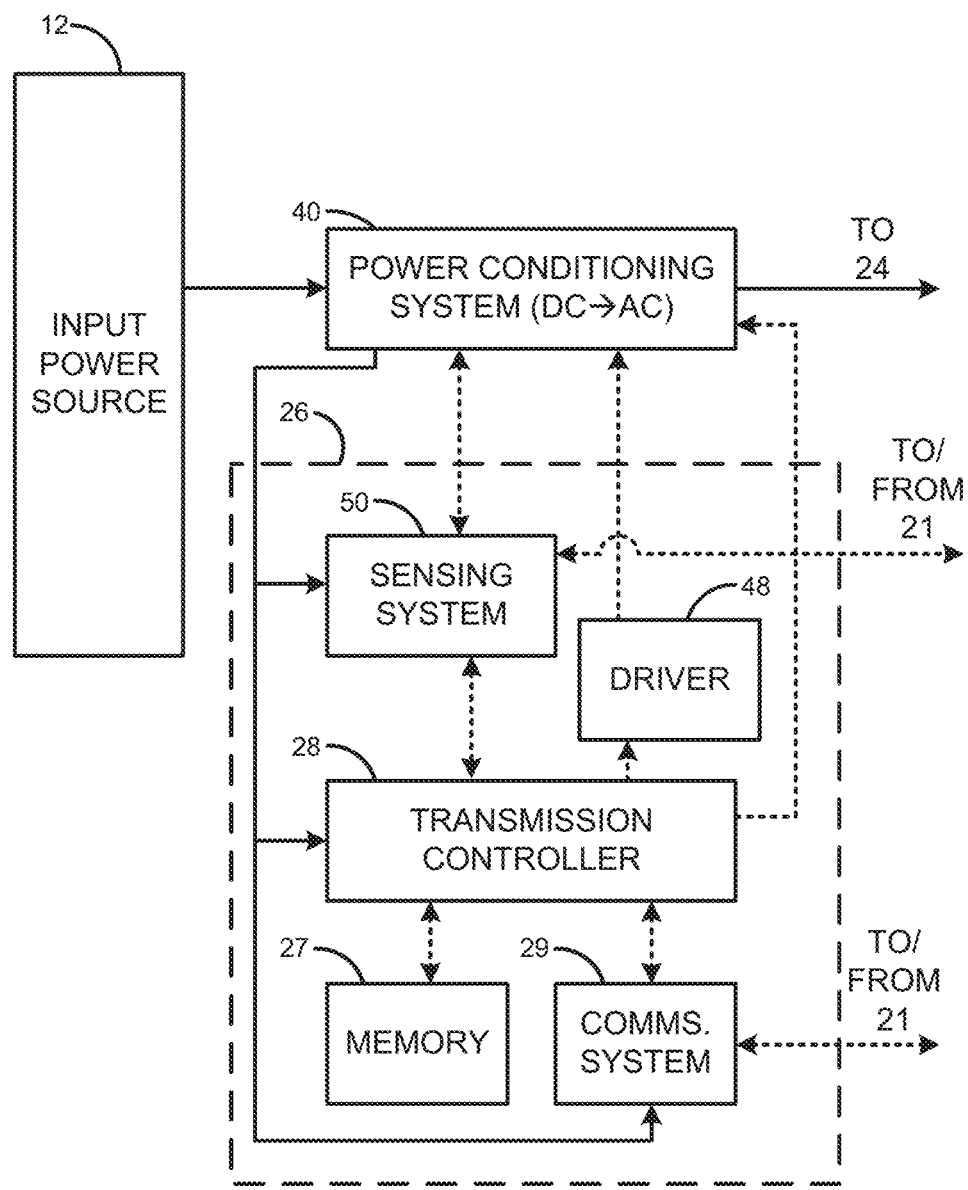
FIG. 3 is a block diagram illustrating components of a transmission control system of the wireless transmission system of FIG. 2, in accordance with FIG. 1, FIG. 2, and the present disclosure.

Referring now to FIG. 3, with continued reference to FIGS. 1 and 2, subcomponents and/or systems of the transmission control system 26 are illustrated. The transmission control system 26 may include a sensing system 50, a transmission controller 28, a communications system 29, a driver 48, and a memory 27.

The transmission controller 28 may be any electronic controller or computing system that includes, at least, a processor which performs operations, executes control algorithms, stores data, retrieves data, gathers data, controls and/or provides communication with other components and/or subsystems associated with the wireless transmission system 20, and/or performs any other computing or controlling task desired. The transmission controller 28 may be a single controller or may include more than one controller disposed to control various functions and/or features of the wireless transmission system 20. Functionality of the transmission controller 28 may be implemented in hardware and/or software and may rely on one or more data maps relating to the operation of the wireless transmission system 20. To that end, the transmission controller 28 may be operatively associated with the memory 27. The memory may include one or more of internal memory, external memory, and/or remote memory (e.g., a database and/or server operatively connected to the transmission controller 28 via a network, such as, but not limited to, the Internet). The internal memory and/or external memory may include, but are not limited to including, one or more of a read only memory (ROM), including programmable read-only memory (PROM), erasable programmable read-only memory (EPROM or sometimes but rarely labelled EROM), electrically erasable programmable read-only memory (EEPROM), random access memory (RAM), including dynamic RAM (DRAM), static RAM (SRAM), synchronous dynamic RAM (SDRAM), single data rate synchronous dynamic RAM (SDR SDRAM), double data rate synchronous dynamic RAM (DDR SDRAM, DDR2, DDR3, DDR4), and graphics double data rate synchronous dynamic RAM (GDDR SDRAM, GDDR2, GDDR3, GDDR4, GDDR5, a flash memory, a portable memory, and the like. Such memory media are examples of nontransitory machine readable and/or computer readable memory media.

While particular elements of the transmission control system 26 are illustrated as independent components and/or circuits (e.g., the driver 48, the memory 27, the communications system 29, the sensing system 50, among other contemplated elements) of the transmission control system 26, such components may be integrated with the transmission controller 28. In some examples, the transmission controller 28 may be an integrated circuit configured to include functional elements of one or both of the transmission controller 28 and the wireless transmission system 20, generally.

As illustrated, the transmission controller 28 is in operative association, for the purposes of data transmission, receipt, and/or communication, with, at least, the memory 27, the communications system 29, the power conditioning system 40, the driver 48, and the sensing system 50. The driver 48 may be implemented to control, at least in part, the operation of the power conditioning system 40. In some examples, the driver 48 may receive instructions from the transmission controller 28 to generate and/or output a generated pulse width modulation (PWM) signal to the power conditioning system 40. In some such examples, the PWM signal may be configured to drive the power conditioning system 40 to output electrical power as an alternating current signal, having an operating frequency defined by the PWM signal.

The sensing system may include one or more sensors, wherein each sensor may be operatively associated with one or more components of the wireless transmission system 20 and configured to provide information and/or data. The term "sensor" is used in its broadest interpretation to define one or more components operatively associated with the wireless transmission system 20 that operate to sense functions, conditions, electrical characteristics, operations, and/or operating characteristics of one or more of the wireless transmission system 20, the wireless receiving system 30, the input power source 12, the host device 11, the transmission antenna 21, the receiver antenna 31, along with any other components and/or subcomponents thereof.

At the power conditioning system 40, electrical power is received, generally, as a direct current (DC) power source, via the input power source 12 itself or an intervening power converter, converting an AC source to a DC source (not shown). The power conditioning system 40 may provide a first electrical power signal to electrically power any components of the wireless transmission system 20 and a second portion conditioned and modified for wireless transmission to the wireless receiver system 30. As illustrated in FIG. 3, such a first portion is transmitted to, at least, the sensing system 50, the transmission controller 28, and the communications system 29; however, the first portion is not limited to transmission to just these components and can be transmitted to any electrical components of the wireless transmission system 20.

The second portion of the electrical power may be provided to an amplifier of the power conditioning system 40, which is configured to condition the electrical power for wireless transmission by the antenna 21. The amplifier may function as an invertor, which receives an input DC power signal and generates an alternating current (AC) as output, based, at least in part, on PWM input from the transmission control system 26. Such an amplifier may be or include, for example, a power stage inverter, such as a dual field effect transistor power stage invertor. The power conditioning system 40 and, in turn, the wireless transmission system 20 enables wireless transmission of electrical signals having much greater amplitudes than if transmitted without such power conditioning. For example, the power conditioning system 40 may enable the wireless transmission system 20 to transmit electrical energy as an electrical power signal having electrical power from about 10 mW to about 500 W.

Returning now to FIG. 2, the conditioned signal(s) from the power conditioning system 40 is then received by the transmission tuning system 24, prior to transmission by the antenna. The transmission tuning system 24 may include tuning and/or impedance matching, filters (e.g. a low pass filter, a high pass filter, a "pi" or "H" filter, a "T" filter, an "L" filter, a "LL" filter, an L-C trap filter, among other filters), network matching, sensing, and/or conditioning elements configured to optimize wireless transfer of signals from the wireless transmission system 20 to the wireless receiver system 30. Further, the transmission tuning system 24 may include an impedance matching circuit, which is designed to match impedance with a corresponding wireless receiver system 30 for given power, current, and/or voltage requirements for wireless transmission of one or more of electrical energy, electrical power, electromagnetic energy, and electronic data.

Figure 4:
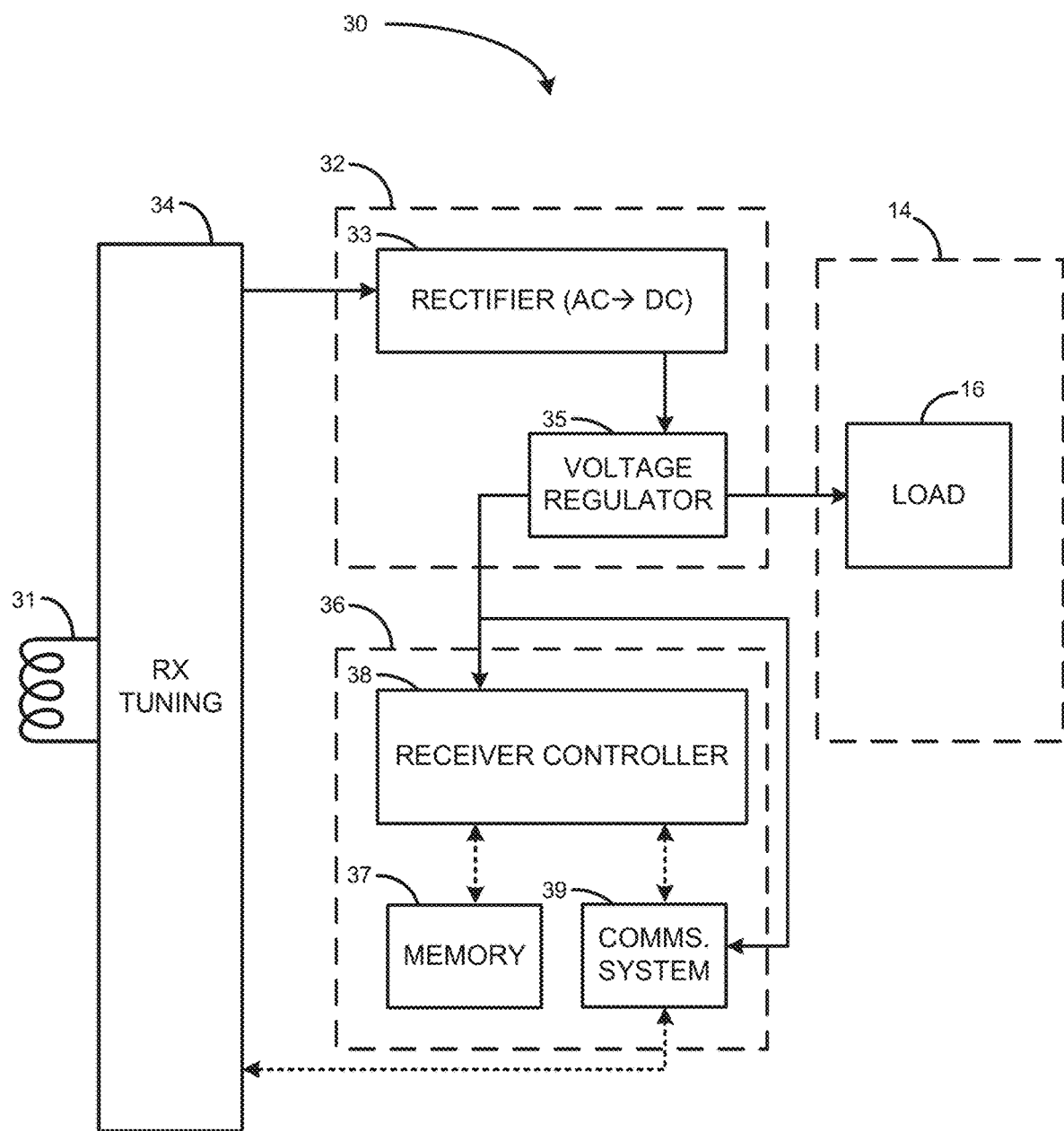
FIG. 4 is a block diagram illustrating components of a sensing system of the transmission control system of FIG. 3, in accordance with FIGS. 1-3 and the present disclosure.

Turning now to FIG. 4 and with continued reference to, at least, FIGS. 1 and 2, the wireless receiver system 30 is illustrated in further detail. The wireless receiver system 30 is configured to receive, at least, electrical energy, electrical power, electromagnetic energy, and/or electrically transmittable data via near field magnetic coupling from the wireless transmission system 20, via the transmission antenna 21. As illustrated in FIG. 4, the wireless receiver system 30 includes, at least, the receiver antenna 31, a receiver tuning system 34, a power conditioning system 32, and a receiver control system 36. The receiver tuning system 34 may be configured to substantially match the electrical impedance of the wireless transmission system 20. In some examples, the receiver tuning system 34 may be configured to dynamically adjust and substantially match the electrical impedance of the receiver antenna 31 to a characteristic impedance of the power generator or the load at a driving frequency of the transmission antenna 20.

As illustrated, the power conditioning system 32 includes a rectifier 33 and a voltage regulator 35. In some examples, the rectifier 33 is in electrical connection with the receiver tuning system 34. The rectifier 33 is configured to modify the received electrical energy from an alternating current electrical energy signal to a direct current electrical energy signal. In some examples, the rectifier 33 is comprised of at least one diode. Some non-limiting example configurations for the rectifier 33 include, but are not limited to including, a full wave rectifier, including a center tapped full wave rectifier and a full wave rectifier with filter, a half wave rectifier, including a half wave rectifier with filter, a bridge rectifier, including a bridge rectifier with filter, a split supply rectifier, a single phase rectifier, a three phase rectifier, a controlled rectifier, an uncontrolled rectifier, and a half controlled rectifier. As electronic devices may be sensitive to voltage, additional protection of the electronic device may be provided by clipper circuits or devices. The rectifier 33 may further include a clipper circuit or a clipper device. A clipper is herein defined as a circuit or device that removes either the positive half (top half), the negative half (bottom half), or both the positive and the negative halves of an input AC signal. In other words, a clipper is a circuit or device that limits the positive amplitude, the negative amplitude, or both the positive and the negative amplitudes of the input AC signal.

Some non-limiting examples of a voltage regulator 35 include, but are not limited to, including a series linear voltage regulator, a shunt linear voltage regulator, a block up switching voltage regulator, a block down switching voltage regulator, an inverter voltage regulator, a Zener controlled transistor series voltage regulator, and an emitter follower voltage regulator. The voltage regulator 35 may further include a voltage multiplier. A voltage multiplier is herein defined as an electronic circuit or device that delivers an output voltage having an amplitude (peak value) that is two, three, or more times greater than the amplitude (peak value) of the input voltage. The voltage regulator 35 is in electrical connection with the rectifier 33 and configured to adjust the amplitude of the electrical voltage of the wirelessly received electrical energy signal, after conversion to AC by the rectifier 33. In some examples, the voltage regulator 35 may be a low dropout linear voltage regulator; however, other voltage regulation circuits and/or systems are contemplated. As illustrated, the direct current electrical energy signal output by the voltage regulator 35 is received at the load 16 of the electronic device 14. In some examples, a portion of the direct current electrical power signal may be utilized to power the receiver control system 36 and any components thereof; however, it is certainly possible that the receiver control system 36, and any components thereof, may be powered and/or receive signals from the load 16 and/or other components of the electronic device 14.

The receiver control system 36 may include, but is not limited to, including a receiver controller 38, a communications system 39, and a memory 37. The receiver controller 38 may be any electronic controller or computing system that includes, at least, a processor which performs operations, executes control algorithms, stores data, retrieves data, gathers data, controls and/or provides communication with other components and/or subsystems associated with the wireless receiver system 30. The receiver controller 38 may be a single controller or may include more than one controller disposed to control various functions and/or features of the wireless receiver system 30. Functionality of the transmission controller 38 may be implemented in hardware and/or software and may rely on one or more data maps relating to the operation of the wireless receiver system 30. To that end, the receiver controller 38 may be operatively associated with the memory 37. The memory may include one or both of internal memory, external memory, and/or remote memory (e.g., a database and/or server operatively connected to the receiver controller 28 via a network, such as, but not limited to, the Internet). The internal memory and/or external memory may include, but are not limited to including, one or more of a read only memory (ROM), including programmable read-only memory (PROM), erasable programmable read-only memory (EPROM or sometimes but rarely labelled EROM), electrically erasable programmable read-only memory (EEPROM), random access memory (RAM), including dynamic RAM (DRAM), static RAM (SRAM), synchronous dynamic RAM (SDRAM), single data rate synchronous dynamic RAM (SDR SDRAM), double data rate synchronous dynamic RAM (DDR SDRAM, DDR2, DDR3, DDR4), and graphics double data rate synchronous dynamic RAM (GDDR SDRAM, GDDR2, GDDR3, GDDR4, GDDR5, a flash memory, a portable memory, and the like. Such memory media are examples of nontransitory computer readable memory media.

Further, while particular elements of the receiver control system 36 are illustrated as independent components and/or circuits (e.g., the memory 37, the communications system 39, among other contemplated elements) of the receiver control system 36, such components may be integrated with the receiver controller 38. In some examples, the receiver controller 38 may be and/or include one or more integrated circuits configured to include functional elements of one or both of the receiver controller 38 and the wireless receiver system 30, generally. "Integrated circuits," as defined herein, generally refers to a circuit in which all or some of the circuit elements are inseparably associated and electrically interconnected so that it is considered to be indivisible for the purposes of construction and commerce. Such integrated circuits may include, but are not limited to including, thin-film transistors, thick-film technologies, and/or hybrid integrated circuits.

Figure 5A:
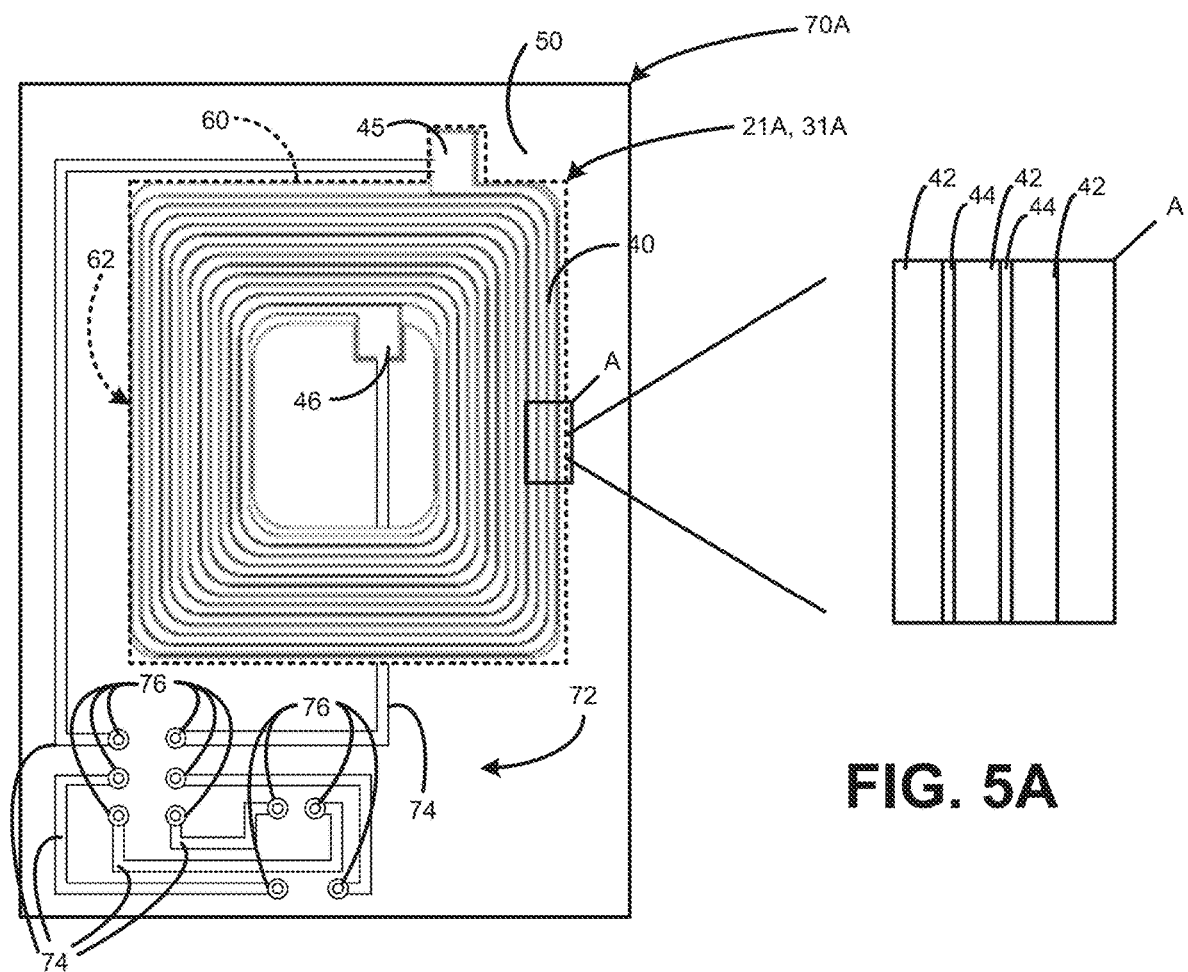
FIG. 5A is a top view of an exemplary wireless power antenna, for use with, for example, the systems of FIGS. 1-4, and manufactured via the systems and methods disclosed herein, in accordance with FIGS. 1-4 and the present disclosure.

Turning now to FIG. 5A, an exemplary embodiment of one or more of the transmission antenna 21 or the receiver antenna 31, which may be used with any of the systems, methods, and/or apparatus disclosed herein, is illustrated. In the exemplary embodiment, the antenna 21, 31, is a flat coil disposed on a substrate 50 of a prefabricated PCB 70. The prefabricated PCB 70A may be any prefabricated PCB that has been cut, etched, chemically etched, plated, and/or otherwise formed, prior to the formation of the antenna 21A in accordance with the systems and methods disclosed herein. The prefabricated PCB 70 may include a PCB design 72, which includes any features for an electronic circuit board, such as, but not limited to, a plurality of traces 74 and a plurality of vias 76. The traces 74 may be utilized to electrically connect components for placement on the prefabricated PCB 70, which may include one or more components of the wireless transmission system 20, the wireless receiver system 30, and/or any components thereof. The vias 76 may be utilized as connection points for said components, for connection to the prefabricated PCB 70, the antenna 21, 31, and/or connection to any of the aforementioned components. A coil area 60 may be designed onto the prefabricated PCB 70, such that the systems and methods disclosed herein may be utilized to laser cut and etch the antenna 21, 31 in the coil area 60.

In the exemplary embodiment shown, the antenna comprises at least one layer of a electrical conductor and at least one electrically insulating layer. In some examples, the antenna 21, 31 may be a multi-layer multi-turn (MLMT) antenna, comprising two or more electrically connected layers of conductors or coils. Non-limiting examples of MLMT antennas can be found in, at least, U.S. Pat. Nos. 9,941,743, 9,960,628, 9,941,743 all to Peralta et al., U.S. Pat. Nos. 9,948,129, 10,063,100 to Singh et al., U.S. Pat. No. 9,941,590 to Luzinski, U.S. Pat. No. 9,960,629 to Rajagopalan et al. and U.S. Patent App. Nos. 2017/0040107, 2017/0040105, 2017/0040688 to Peralta et al., all of which are assigned to the assignee of the present application and incorporated fully herein by reference.

In addition, the antenna 21, 31, 121 may be constructed having a multi-layer-multi-turn (MLMT) construction in which at least one insulator is positioned between a plurality of conductors. Non-limiting examples of antennas having an MLMT construction that may be incorporated within the wireless transmission system(s) 20 and/or the wireless receiver system(s) 30 may be found in U.S. Pat. Nos. 8,610,530, 8,653,927, 8,680,960, 8,692,641, 8,692,642, 8,698,590, 8,698,591, 8,707,546, 8,710,948, 8,803,649, 8,823,481, 8,823,482, 8,855,786, 8,898,885, 9,208,942, 9,232,893, 9,300,046, all to Singh et al., assigned to the assignee of the present application are incorporated fully herein.

As illustrated, the antenna 21, 31 includes, at least, a first conductive layer 40 disposed on a substrate 50, the first conductive layer 40 including a plurality of coil turns 42. Each of the plurality of coil turns are separated by a turn gap 44, which is best illustrated in the exemplary zoomed-in portion A of the antenna 21, 31. Portion A illustrates exemplary turns 42 of the antenna 21, 31, with turn gaps 44 in between. The antenna 21, 31 further includes, at least, a first connection terminal 45 and a second connection terminal 46. The first and second connection terminals 45, 46 may be utilized for one or more of electrically connecting the antenna 21, 31 to other components of one or more of the wireless transmission system 20, the wireless receiver system 30, or the system 10. In some examples, the connection terminals 45, 46 may be connected to other components of the prefabricated PCB 70, via, for example, one or more traces 74 and/or vias 76. Additionally or alternatively, the connection terminals 45, 46 may be utilized for connecting the first conductive layer 40 to one or more additional conductive layers of the antenna 21, 31, which will be discussed in more detail, below, with reference to other embodiments for the antenna 21, 31.

Figure 5B:
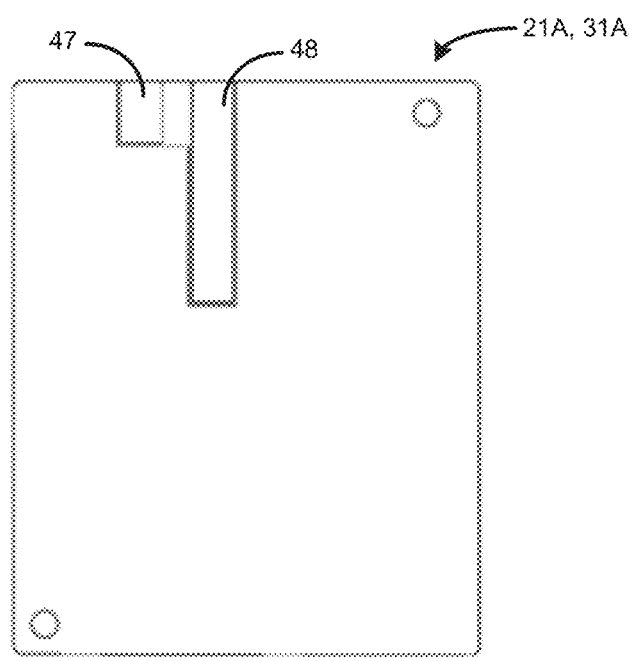
FIG. 5B is a bottom view of the exemplary wireless power antenna of FIG. 5A, in accordance with FIGS. 1-5A and the present disclosure.

Further, as illustrated in FIG. 5B, which shows an exemplary rear side of the antenna 21, 31, wherein the antenna 21, 31 includes first and second rear connectors 27, 28 which, similarly to the first and second connection terminals 45, 46, may be utilized for one or more of electrically connecting the antenna 21, 31 to other components of one or more of the wireless transmission system 20, the wireless receiver system 30, or the system 10. Additionally or alternatively, the rear connection terminals 47, 48 may be utilized for connecting the first conductive layer 40 and/or one or more other conductive layers to another conductive layer of the antenna 21, 31, which will be discussed in more detail, below, with reference to other embodiments for the antenna 21, 31.

Figure 5C:
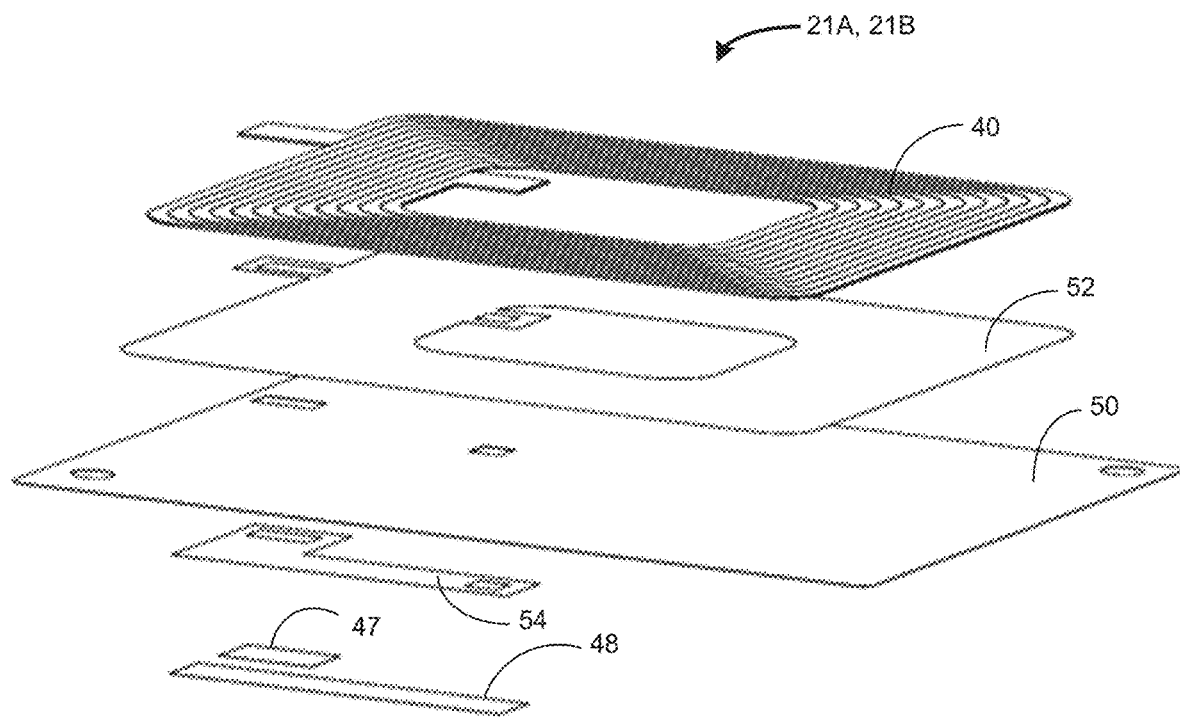
FIG. 5C is an exploded view of components of the exemplary wireless power antenna of FIGS. 5A and 5B, in accordance with FIGS. 1-5B and the present disclosure.

FIG. 5C illustrates an exploded view of an assembly for an embodiment of the antenna 21, 31. As illustrated, the antenna 21, 31 includes the substrate 50 with the at least one conductive layer 40 affixed thereto. In designing an antenna, it is understood that suitability of the substrate relative to the application is an important, as the substrate properties such as, but not limited to, the dielectric constant, the loss tangent, and/or the relative permittivity of the substrate; such substrate properties can have significant effect on the antenna characteristics.

The substrate 50 may be comprised of, for example, a polymer layer. The substrate may further be selected from the group consisting of a paper base class, a glass fiber cloth base class, a composite epoxy material (CEM), a lamination multilayer base class, a special material base class, a flameproof type, a non-flameproof type, a copper clad laminate (CCL) with ordinary performance, a CCL with low dielectric constant, a CCL with high heat resistance, a CCL with low coefficient of thermal expansion, and combinations thereof. A paper base class may further comprise a phenolic resin or a phenol formaldehyde resin (PF), such as ANSI-LI-1 XPC (BS 4584 PF-CP-Cu-4), ANSI-LI-1 FR1 (BS 4584 PF-CP-Cu-6), ANSI LI-1 FR2 (BS 4584 PF-CP-Cu-8), an epoxy resin (FE-3), a polyester resin, aramid papers or combinations thereof. A glass fiber cloth base class may further comprise an epoxy resin such as ANSI-LI-1 FR4 (BS 4584 EP-GC-Cu-2), FR5 (similar to FR4 but in a high temperature epoxy resin) and combinations thereof. A special material base class may further comprise a ceramic, such as alumina, metal core base, glass fiber cloth, polyamide, non-woven fabrics, bismaleimide trazine (BT) epoxy or resin, polyimide (PI), polyphenylene oxide (PPO), maleic anhydride imide-styrene (MS) resin, polycyclic ester resin, polyolefin resin, multi-functional epoxy, tetra-functional epoxy, cyanate ester, teflon, fluorine-based resin or combinations thereof. A flameproof type resin may further comprise UL94 materials for example, UL94-VO, UL94-V1, or combinations thereof. A non-flameproof type resin may further comprise a UL94-HB material. The substrate may further comprise Duroid, Benzocyclo butane, Roger 4350, FR4-epoxy, Bakelite.

As illustrated, in some examples, the conductive layer 40 may be affixed to the substrate 50 using first adhesive sheet 52, which may be positioned between the conductive layer 40 and the substrate 50. In some examples, the antenna 21, 31 may include a second adhesive sheet 54, utilized for laminating the rear connection terminals 47, 48 to the underside of the substrate 50. The rear connection terminals 47, 48 may be connected to one or more connectors of the conductive layer 40 via, for example, a spot welding process performed during manufacture of the antenna 21, 31. In order to allow both conductive layers to be spot welded, there may be cutouts or splits in the adhesive sheets on one or both sides.

Figure 6:
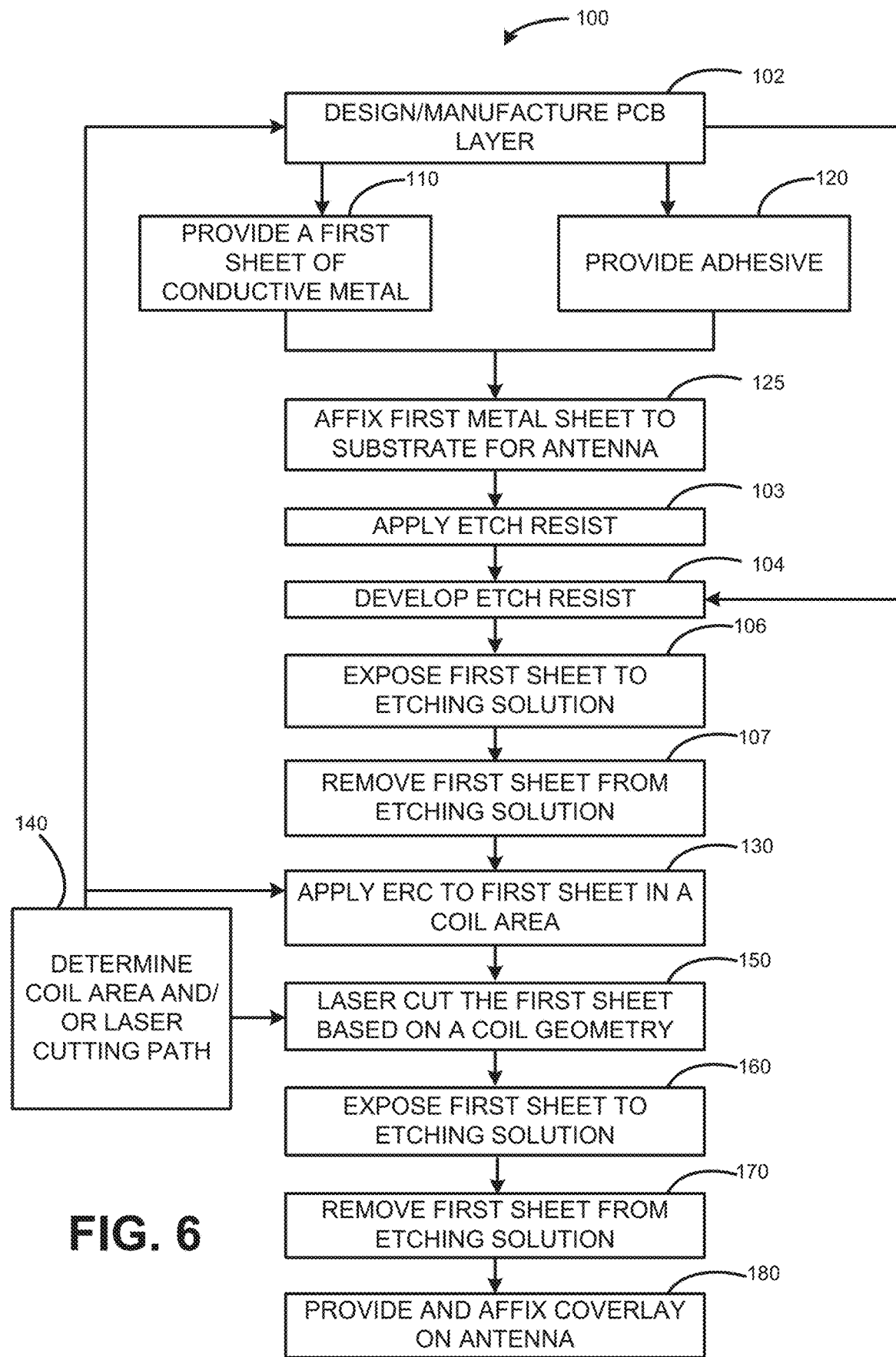
FIG. 6 is a flowchart for an exemplary method for manufacturing the wireless power antenna of FIGS. 5A-C, in accordance with FIGS. 1-5C and the present disclosure.

Turning now to FIG. 6 and with continued reference to FIGS. 5A-C, a block diagram for a method 100 for manufacturing an antenna 21A, 31A is illustrated. The method 100 begins at block 102, wherein the prefabricated PCB 70 is more or more of provided, designed, and/or manufactured, prior to the formation of the antenna 21, 31 via the method 100. The prefabricated PCB 70 includes an unetched coil area 60, for use in fabricating the antenna 21, 31.

Accordingly, at block 110, a first sheet of a conductive metal for the coil area 60 is provided. The conductive metal may be a metal from which one or more of the PCB design 72, the traces 74, the vias 76, the coil area 60, or combinations thereof are formed. The conductive metal may be any conductive metal, such as, but not limited to, copper and/or copper alloys, aluminum and aluminum alloys, iron and iron alloys, nickel and nickel alloys, silver and/or silver alloys, and gold and/or gold alloys. The conductive metal of an antenna may further be selected from the group consisting of copper, aluminum, silver, nickel, gold, stainless steel, phosphorus bronze, beryllium-copper alloys, copper-nickel, nickel-chromium, conductive polymer thick film composites, toner/lithographic inks, and combinations thereof. In some examples, wherein the conductive metal is copper and/or a copper alloy, the copper and/or copper alloy may be one or more of half-ounce copper, one-ounce copper, two-ounce copper, or any combinations thereof. The first sheet is a conductive metal that is suitable for use in forming one or more of the layer 40, the coil turns 42, the connection terminals 45, 46, 47, 48, or any combinations thereof.

The method 100 further includes providing one or more of the first adhesive sheet 52 and the second adhesive sheet 54, as illustrated in block 120. The first and second adhesive sheets 52, 54 may be pressure sensitive adhesives (PSA), configured for affixing the first sheet for the conductive layer 40 to the substrate 50, as illustrated at block 125. Such PSAs, for use as one or both of the adhesive sheets 52, 54, may comprise or include one or more of an acrylic, a rubber, a tape, a glue, or any combinations thereof. PSAs may be particularly useful, as they may not solidify to form a solid material, but remain viscous. As a result, PSAs remain permanently tacky and have the ability to wet surfaces on contact. Bonds are made by bringing the PSA in contact with the substrate and applying pressure. A PSA sheet may comprise backing, the backing comprising one of a cloth, a paper, a metal, a plastic or combinations thereof. The backing may be coated on one (single coated) or both (double coated) sides by the permanently tacky adhesive. The permanently tacky adhesive is adherable to a variety of surfaces with light pressure (finger pressure) and with no phase change (liquid to solid). A PSA may be provided as a single sheet fit to size or in a roll form so that the sheet can be cut to a specific size in accordance with the need of an application. PSAs can be blends of natural or synthetic rubber and resin, acrylic, silicone or other polymer systems, with or without additives. Pending the design of an antenna, the antenna may comprise a single coated PSA sheet, a double coated PSA sheet, or combinations thereof. PSAs are typically formulated from natural rubber, certain synthetic rubbers, and polyacrylates.

Additionally or alternatively, the adhesive sheets 52, 54 may include one or more of high-performance flex and rigid-flex laminates and adhesive systems. Such flex and rigid-flex laminates and adhesives provide for flexible laminates, embedded passives and thermal performance for demanding applications, and may also include core dielectric materials and customized constructions that enable low loss high-speed high-frequency applications, high service temperature applications and allow options for single sided and double-sided, multi-layer flex and rigid-flex antenna designs. The adhesive sheets 52, 54 may be acrylic-based, polyimide-based, epoxy-based, modified epoxy-based, fluoropolymer-based, polyester-based, phenolic-based, and include copper-clad type adhesive sheets. In some examples, the adhesive sheets 52, 54 may include a tape, such as a Tesa tape, which may be chosen based on a specific application and can be selected for one or more of low cost, high operating temperature, environmental characteristics, among other things.

With the first layer for the conductive layer 40 affixed to the substrate 50, the method 100 then includes applying an etch resistant coating (ERC) on, at least, a coil area 60 of the first sheet for the conductive layer 40, as illustrated in block 130. As illustrated with dotted lines in FIG. 5A, the coil area 60 may be any area on the pre-etched/laser cut first layer for the conductive layer, on which the resultant conductive layer 40 sill reside, including all of the turns 42, connection terminals 45, 46, gaps 44, among other conductive layer 40 characteristics. The etch resistant coating is utilized to keep portions of the first sheet, from which the first conductive layer 40 will be formed, from disintegrating off of the substrate 50, when the substrate 50, with the first sheet affixed, is exposed to an etching solution. The etch resistant coating is a compound capable to resist etching by common chemicals used in PCB manufacturing process, such a, but not limited to, cupric chloride (CuCl2) or Ferric chloride (FeCl3). The etch resistant coating may be easy to remove (e.g., washable) or permanent. While etch resists commonly used in PCB etching may require an exposure to activate resistant characteristics prior to etching, it is important to note that the ERC does not require a light or any other electro-magnetic radiation source of exposure, or any alternative source of exposure, for it to be resistive to an etching solution. The etch resistant coating may be any proper etch resistant coating known in the art, such as, but not limited to, a lamination, a polymer compound that is applied via spraying or as a thin film from a roll, a metal based thin film created by way of electrochemical plating or vapor deposition in a vacuum (PVD), or combinations thereof. ERC can be sub-micron thin (PVD), or as thick as 50 micrometers (e.g., a spray coating or film).

In some examples, the method 100 includes determining one or both of the coil area 60 and a laser cutting path for the first conductive layer 40, as illustrated in block 140. Determining the coil area 60 may include determining one or more of a geometry 62 for the conductive layer 40, a location relative to the substrate 50 for the first conductive layer 40 and/or components thereof, locations for turns 42 and/or gaps 44 of the conductive layer 40, or combinations thereof. Determining the laser cutting path for the conductive layer 40 may include determining a path for a laser to cut features of the conductive layer into the first sheet. Laser cutting will be discussed in more detail below, with reference to block 150. The laser cutting path may include instructions for generating the coil geometry 62, which may include geometry for one or more of the turns 42, the gaps 44, the connection terminals 45, 46, 47, 48, any other geometric features of the conductive layer 40, or combinations thereof. The laser cutting path may be a simulation, program, and/or electronic document to be utilized by a controller associated with a laser, for cutting the coil geometry 62 into the first sheet, to form the conductive layer 40. Alternatively, the laser cutting path may be instructions provided to a user of a laser, the user guiding the laser, based on the laser cutting path, for cutting the coil geometry 62 into the first sheet, to form the conductive layer 40.

At block 150, the method 100 includes laser cutting the first sheet, at least within the coil area 60, based on the laser cutting path of block 140. The coil geometry 62 includes, at least, instructions defining a plurality of turns for the first conductive layer 40 for the antenna 21A, 31A. The first geometry 62 may be configured to generate a coil for the antenna 21A, 31A, at the first layer 40, such that the antenna 21A, 31A is utilized for one or more of transmission of wireless power signals, receipt of wireless power signals, and combinations thereof. The laser used for block 150 may be any suitable cutting laser, such that the laser is capable of cutting through, at least in part, the conductive metal layer of the first sheet for the conductive layer 40.

Laser cutting may comprise either a pulsed beam or a continuous wave beam, with the former being delivered in short bursts while the latter being delivered continuously. Laser beam intensity, length and heat output may be controlled depending on the material being laser cut. A mirror or special lens can further be used to fine-focus the laser beam for precision coil-to-coil spacing, demanding coil turn structures, critical gap dimensions and/or demanding tolerance requirements for same. The laser for block 150 may include one or more of a gas laser, a crystal laser, a fiber laser, and/or other lasers, which are capable of cutting through, at least in part, a conductive metal. A gas laser for block 150 may further comprise a CO2 laser, the crystal laser may further comprise an nd:YAG (neodymium-doped yttrium aluminum garnet) laser or an nd:YVO (neodymium-doped yttrium ortho-vanadate) laser, and the fiber laser may further comprise a glass fiber laser, comprising a solid gain medium and a 'seed laser', wherein the 'seed laser' produces a laser beam that is then amplified using glass fibers and pump diodes.

After the laser cutting of block 150 is performed, the method 100 includes exposing the first sheet in an etching solution, to remove unwanted conductive metal from the first sheet and/or the substrate 50, upon which the first sheet for the conductive layer 40 lies. Accordingly, submerging the first sheet in the etching solution may remove substantially all of the conductive materials of the first sheet, outside of the coil area 60. Locations within the coil area 60, upon which the etch resistant coating of block 130 was applied and not cut by the laser, should substantially remain affixed to the substrate 50 and be utilized to form the conductive layer 40. The solution(s), chemical(s), apparatus, and/or process(es) of the etching solution for block 150 may include, but are not limited to including, one or more of acids, alkalies, alcohols, halogens, and combinations thereof in which the material to be etched is soluble. The solution(s), chemical(s), apparatus, and/or process(es) of the etching solution for block 150 may include, but are not limited to including, mixed acids, ionic gases, molten fluxes, and combinations thereof. For example, copper and copper alloys are soluble in $HNO_3$, hot $H_2SO_4$, HCl and $NH_4OH$. $FeCl_3$, mixed acids, ionized gases and combinations thereof. Etchants for copper and copper alloys therefore may comprise an alkali etch such as NaOH, $H_2SO_4$ and $HNO_3$, or an acid etch selected such as a concentrated $HNO_3$, or a dilute $HNO_3$, or a dilute HCl, or $HNO_3$ and $FeCl_3$. The etchants for copper are not meant to be limiting, but only exemplary to the invention. It is understood that the chemical etchant is selected in accordance with the solubility of the material being etched. One is referred to the Handbook of Metal Etchants, ISBN 0-8493-3623-6, the contents of which are fully incorporated herein by this reference, for guidance in the selection of chemical etchants By performing the laser cutting of block 150 prior to exposing the first sheet in the etching solution at block 160, the laser cutting of the coil geometry 62, will remove the substantially all of the etch resistant coating and at least some of the conductive metal, from locations on the conductive metal, such locations defining, at least, the turn gaps 44 of the antenna 21, 31. Accordingly, while the laser cutting of block 150 may remove all conductive metals of the first sheet at the locations for the turn gaps 44, in some examples the laser cutting may not remove all materials within the area of the coil area 60 designated for the gaps 44, in accordance with the coil geometry 62. Therefore, the process of block 160, as performed after the process of 150, may remove excess materials from within the intended gaps 44 of the coil geometry 62; thus avoiding shorts between turns 44 due to improper gaps and/or etching more precise gaps, in comparison to a laser cutting and/or etching, performed alone.

By utilizing blocks 150 and 160, in succession, smaller gaps between neighboring traces 44 are achieved, compared to legacy processes for etching PCB wireless power antennas. Because the excess materials that may be left in the gaps 44 can be removed, as the laser cutting has removed the etch resistant coating from the locations of the gaps 44 in the coil area, the etching process of block 160 will effectively remove any unwanted conductive metal still residing within the intended gaps 44. Thus, this combination of steps in the method 100 allows for smaller cuts to be made, via lasers, with the additional step of clearance of said gaps by etching; said smaller cuts will generate smaller gaps 44 and larger traces 42, within a given coil area 60. An antenna 21A, 31A with wider traces 42 and/or smaller gaps 44 and/or a greater number of turns 42 allowed within the coil area 60 may result in an antenna 21A, 31A with greater performance characteristics, in comparison to a similar antenna with a coil area similar to the coil area 60, but having narrower traces and/or larger gaps and/or less turns within its respective coil area. More specifically, antennas 21A, 31A, as manufactured with the method 100, may have a greater quality factor and/or prove more efficient for wireless power receipt when used as a receiver antenna 31 of the receiver system 30. Further, such antennas 31 manufactured according to the method 100 may be particularly useful in lower frequency wireless power receipt applications, such as, but not limited to, use in Qi wireless power receivers, operating at an operating frequency in a range of about 87 kHz to about 205 kHz.

Returning now to the method 100, after etching at block 160, the method 100 may include removing the first sheet from the etching solution, as illustrated at block 170. After removing the first sheet from the etching solution, the method may further include providing and affixing a coverlay to one or more of a front of the substrate and/or conductive layer 40 and a rear of the substrate and/or any conductive layers thereon, as illustrated in block 180. The coverlay may be any covering intended to insulate, protect, and/or otherwise obscure a face of the antenna 21A, 31A, such as, but not limited to, a laminating of the antenna 21A, 31A.

Figure 7A:
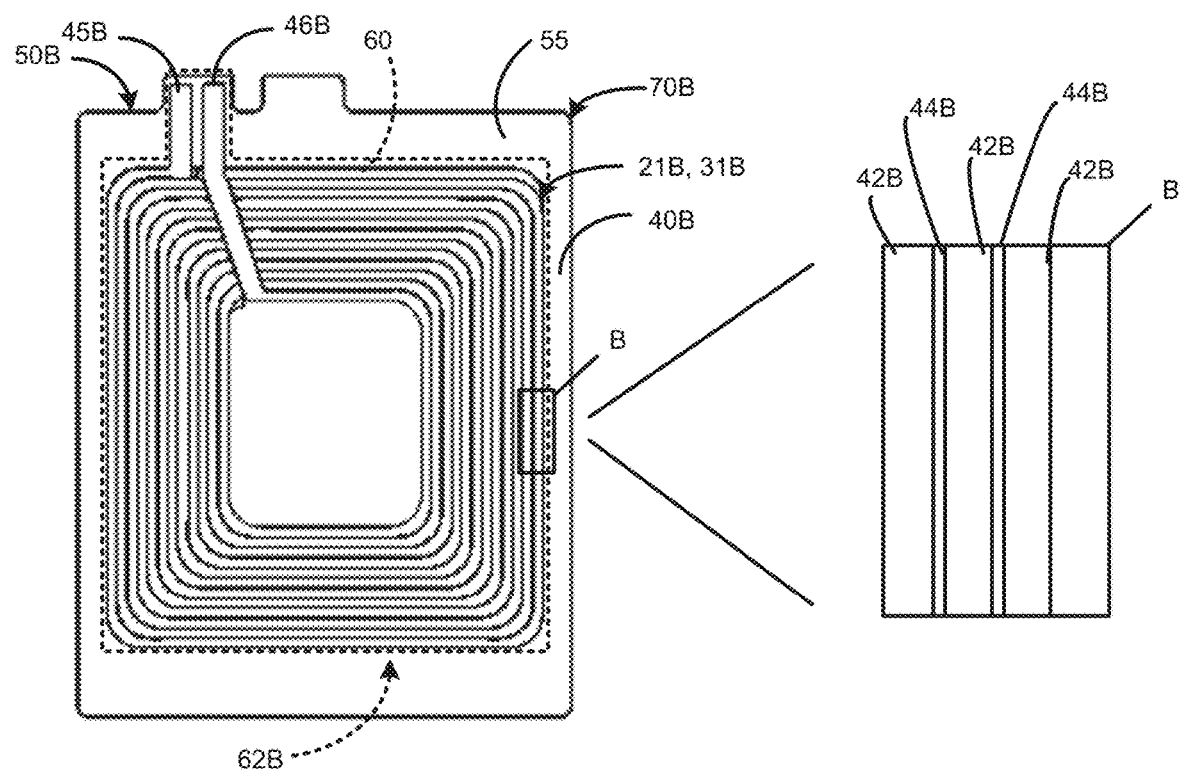
FIG. 7A is a top view of another exemplary wireless power antenna, for use with, for example, the systems of FIGS. 1-4, and manufactured via the systems and methods disclosed herein, in accordance with FIGS. 1-6 and the present disclosure.
Figure 7B:
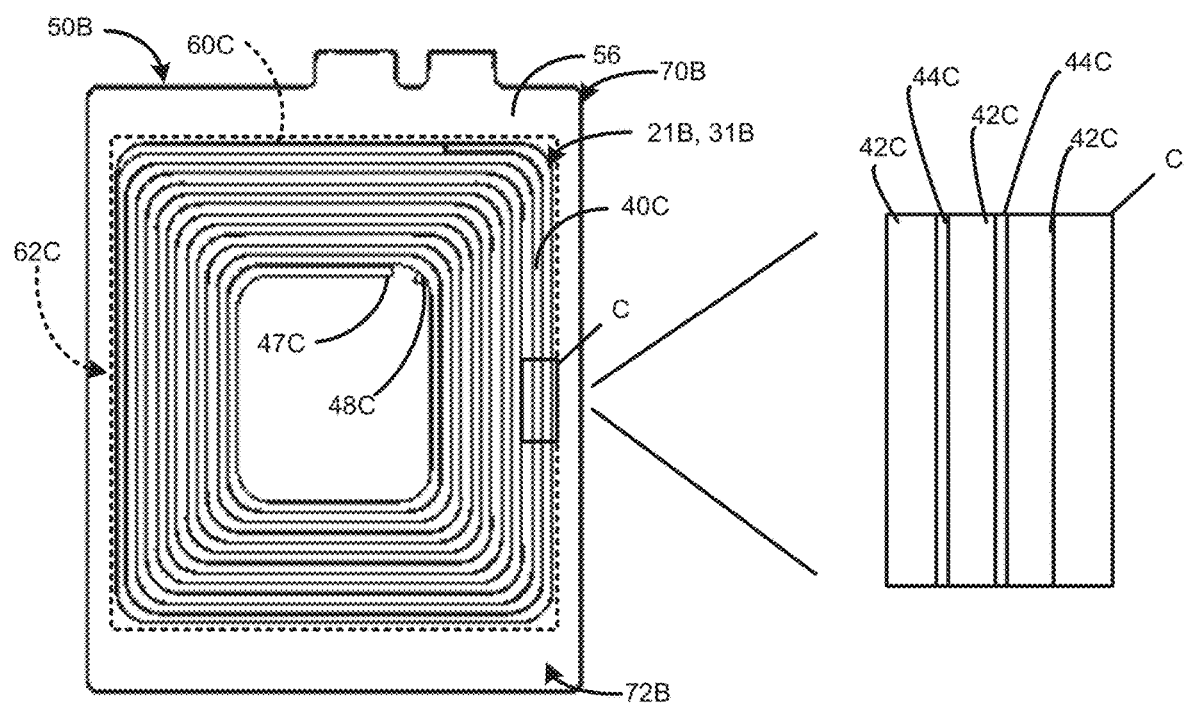
FIG. 7B is a bottom view of the exemplary wireless power antenna of FIG. 7A, in accordance with FIGS. 1-7A and the present disclosure.
Figure 7C:
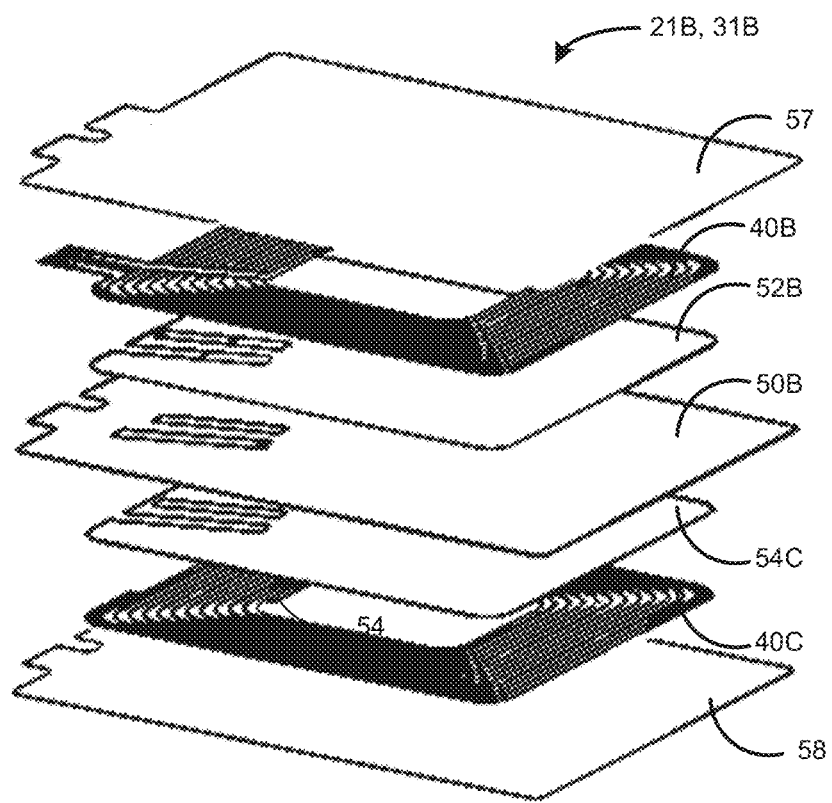
FIG. 7C is an exploded view of components of the exemplary wireless power antenna of FIGS. 7A and 7B, in accordance with FIGS. 1-7B and the present disclosure.

Turning now to FIGS. 7A-C, another embodiment of an antenna 21B, 31B on a prefabricated PCB 70B is illustrated. The prefabricated PCB 70B and/or the antenna 21B, 31B may include similar and/or equivalent elements to those of the prefabricated PCB 70A and/or the antenna 21A, 31A of FIG. 5 and, thus, the descriptions of elements of FIG. 5 may be utilized in describing like elements of FIG. 7. While not shown, the prefabricated PCB 70B may include a PCB design 72B, for one or more layers of the prefabricated PCB 70B, the PCB design 72B including like or similar elements to the PCB design 72A of FIG. 5.

In contrast to the antenna and PCB of FIG. 5, the antenna 21B, 31B includes multiple conductive antenna layers 40, such as, but not limited to, a first conductive layer 40B and a second conductive later 40C. The first conductive layer 40B may be affixed to a first side 55 of a substrate 50B and the second layer may be affixed to a second side 56 of the substrate 50B. The first conductive layer 40B may be formed in accordance with a coil geometry 62B at a coil area 60B, wherein the coil geometry 62B provides guidance for forming first traces 42B with first gaps 44B therebetween. Similarly, the second conductive layer 40C may be formed in accordance with a coil geometry 62C at a coil area 60C, wherein the coil geometry 62C provides guidance for forming second traces 42C with second gaps 44C therebetween. Additionally, the first conductive layer 40B includes first and second connection terminals 45B, 46B and the second conductive layer 40C includes third and fourth connection terminals 47C, 48C. In some examples, the first and second terminals 45B, 46B may be connected in electrical parallel with the third and fourth connection terminals 47C, 48C, with respect to an incoming current to the antenna 21B, 31B. Further, similar to the adhesive layer 52 of FIG. 5, as best illustrated in FIG. 7C, the antenna 21B, 31B may include first and second adhesive layers 52, 54 utilized for affixing the first and second conductive layers 40B, 40C to the first and second sides 55, 56 of the substrate 50B.

Figure 8:
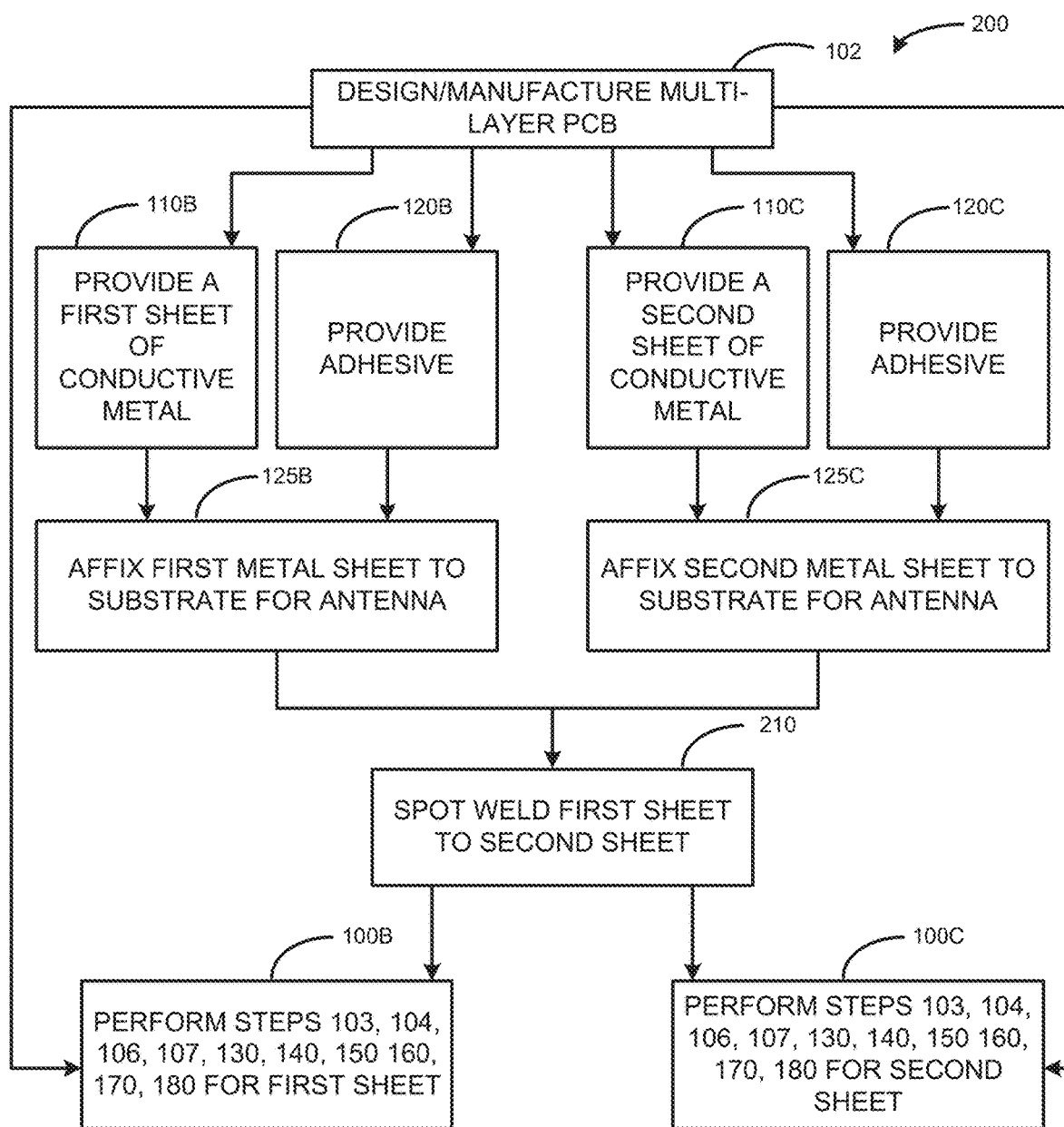
FIG. 8 is a flowchart for an exemplary method for manufacturing the wireless power antenna of FIGS. 7A-C, in accordance with FIGS. 1-7C and the present disclosure.

Additionally, the antenna 21B, 31B may be formed in accordance with blocks similar to those of the method 100 of FIG. 6, with multiple blocks repeated for each of the conductive layers 40. To that end, FIG. 8 is a block diagram for a method 200 for manufacturing the antenna 21B, 31B. The method 200 includes similar and/or equivalent blocks to those of the method 100 of FIG. 6 and, thus, similar and/or analogous number labelling is used and the descriptions, with respect to FIG. 6, of said blocks apply to those similar elements of FIG. 8.

The method 200 begins at block 102, wherein the prefabricated PCB 70 is more or more of provided, designed, and/or manufactured, prior to the formation of the antenna 21, 31 via the method 200. The prefabricated PCB 70 includes an unetched coil area 60, for use in fabricating the antenna 21, 31, on one or more layers of the prefabricated PCB 70. The method 200 continues with one or more of providing first and second sheets for the conductive layers 40B, 40C (blocks 110B, 110C), providing the adhesive layers 52B, 54C (blocks 120B, 120C), and affixing the first and second sheets for the conductive layers 40B, 40C to the substrate 50B using the adhesive layers 52B, 54C (blocks 125B, 125C). The first sheet for the first conductive layer 40B may be affixed to the first side 55 of the substrate 50B and the second sheet for the second conductive layer 40C may be affixed to the second side 56 of the substrate 50B.

At block 210, the method 200 includes spot welding the first sheet for the first conductive layer 40B to the second sheet for the second conductive layer 40C. Such spot welding may be performed through the substrate 50B at, for example, one or more of a through hole, a via, forming an opening in the substrate, or any combinations thereof, amongst other connectors for the first and second conductive layers 40C. In some examples, the spot welding of block 210 may connect the first and second conductive layers 40B, 40C at a spot in the respective coil areas 60B, 60C that are designated by the coil geometries 60B, 60C for connection terminals 45B, 46B, 47C, 48C. For example, the spot welding may be configured such that, after laser cutting and etching, said welds will connect the first connection terminal 45B with the third connection terminal 47C and connect the second terminal 46B with the fourth connection terminal 48C, such that the first conductive layer 40B and the second conductive layer 40C are in electrical parallel, with respect to an electrical current entering/exiting the conductive layers 40B, 40C at the connection terminals 45B, 46B, 47C, 48C.

After step 210, the method 200 may include blocks 100B and 100C, wherein one or more blocks/steps of the method 100 may be repeated for each of the first sheet and second sheet, to form the first and second conductive layers 40B, 40C and all features thereof. Accordingly, block 100B may include performing blocks 140, 150, 160, 170, and/or 180 of the method 100, to the first sheet for the first conductive layer 40B. Similarly, block 100C may include performing blocks 140, 150, 160, 170, and/or 180 of the method 100, to the second sheet for the second conductive layer 40C.

As discussed above, performing the methods 100, 200 in manufacturing one or more of the antennas 21A, 31A, 21B, 31B may allow for the ability to manufacture higher efficiency and/or quality factor (Q) antennas for wireless power transfer, due to one or more of decrease in gap width, increases in turn width, or increases in number of turns within a given area. Experimental results have shown that, when using the systems and methods disclosed herein, beneficial, narrow gap widths, which result in the benefits discussed above, are achieved at various thicknesses of copper for the metal sheets, such as a gap of about 50 microns when the copper is about half-ounce copper, a gap of about 75 microns when the copper is about one-ounce copper, a gap of about 100 microns when the copper is two-ounce copper, and a gap of about 125 microns when the copper is three-ounce copper. Further, even smaller gaps can be achieved, utilizing laser technology with further advanced precision and/or power of operations. Such narrow gap widths may allow for the performance benefits and/or electrical characteristics, discussed above.

In some example experimental results wherein two ounce copper was used for the sheets of metal that were cut and etched to form the conductive layer(s) 40, utilizing the systems and methods disclosed herein, it was found that the processes could consistently achieve gap widths of about 90-100 microns between turns of the conductive layer(s). Power transfer characteristic test measurements were performed on the experimental test results of the systems and methods disclosed herein and antennas 21, 31, with envelope dimensions measuring 45×45 mm, were produced having at least about a 10 percent to 15 percent improvement in one or both of quality factor (Q) or equivalent series resistance (ESR) in the antenna 21, 31, when compared to a comparable antenna, manufactured via known, conventional means for producing a PCB antenna of the same or similar topology. Further, it was found that improvements in efficiency, Q, and ESR were more pronounced in antennas configured for operation at lower operating frequencies, such as those in a range of about 87 kHz to about 205 kHz.

Figure 9:
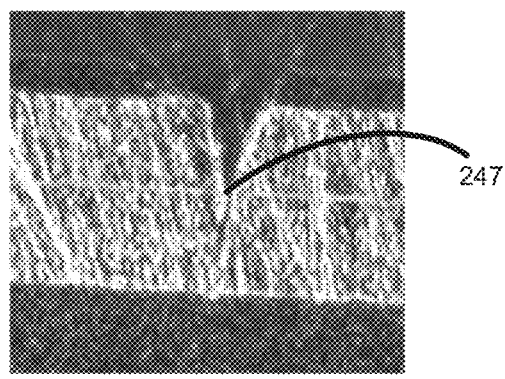
FIG. 9 is a zoomed in image of an exemplary layer of conductive metal of an antenna, subsequent to a laser cutting step of the systems and methods disclosed herein, in accordance with FIGS. 1-8 and the present disclosure.
Figure 10:
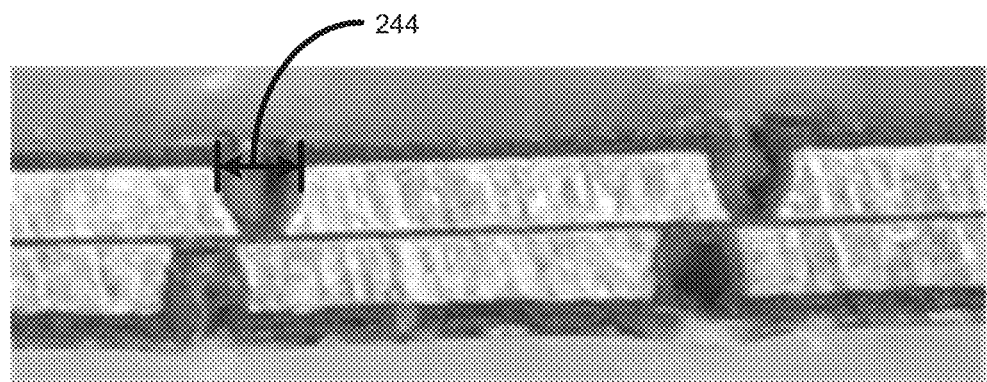
FIG. 10 is a zoomed in image of a layer of conductive metal, etched utilizing legacy methods for etching traces and/or gaps for an antenna.

Images illustrating experimental results utilizing the systems and methods of FIGS. 5-8 are illustrated in FIGS. 9 and 10. FIG. 9 shows a zoomed in image of a conductive layer for a cut 247 made by a laser used in performing functions of the systems and methods of FIGS. 5-8. As illustrated, the cut 247 may not fully penetrate the conductive metal layer and, thus, may cause a short in an antenna made from the conductive material. Accordingly, as discussed above, an etching process may then be used to clear out the cut 247 in the conductive layer to produce a suitable trace gap for an antenna.

FIG. 10 illustrates such a scenario, wherein a laser cut (e.g., the cut 247 of FIG. 9) is made and then the conductive layer, upon which one or more of such cuts lie, is submerged in an etching solution, as discussed above with reference to FIGS. 5-8. FIG. 10 shows a trace gap 247 produced by the systems and methods of FIGS. 5-8. By utilizing the systems and methods of 5-8, the trace gap 247 extends from the top surface of the conductive metal all the way to the top surface of a substrate, upon which the conductive layer lies; thus, by utilizing the systems and methods of FIGS. 5-8, the trace gap 247 is produced without causing any shorts in the resultant antenna of the conductive metal.

Figure 11:
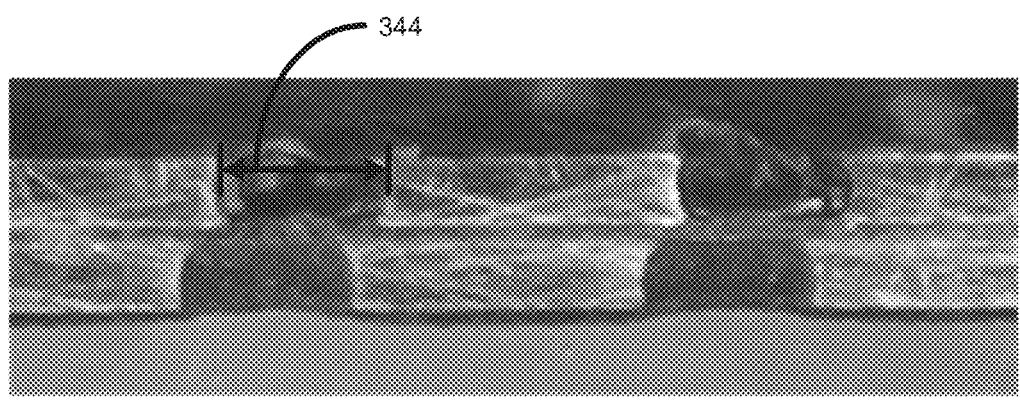
FIG. 11 is a zoomed in image of a cross-section of two layers of conductive metal, etched utilizing legacy methods for etching traces and/or gaps for an antenna.

Additionally, due to the utilization of the systems and methods of FIGS. 5-8, the trace gap 247 may be considerably narrower than the narrowest trace gaps that can be produced by a traditional PCB etching process for producing an antenna. For example, FIG. 11 illustrates a trace gap 344 on a comparable conductive metal sheet for a similarly typed antenna as those of the image of FIG. 10. The images of FIGS. 10 and 11 are produced at a relatively comparable size scale and, as shown, such scale elucidates that a width of the trace gap 247, produced by the systems and methods of FIGS. 5-8, may be significantly narrower than a width of the trace gap 344, produced by traditional PCB etching processes. For example, the trace gap 247 may have a width in a range of about 0.05 millimeters (mm) to about 0.095 mm, whereas the trace gap 347 may have a width in a range of about 0.125 mm to about 0.2 mm. As discussed above, smaller trace gaps produce significant benefits on performance of such antennas and, thus, utilizing the systems and methods disclosed herein provides for improved antennas versus antennas produced by legacy PCB etching methods, as exemplified by the comparison of FIGS. 10 and 11.

In addition to performance benefits achieved via the systems and methods disclosed herein, the utilization of the combination of laser cutting and chemical etching results in a decrease in time spent manufacturing the antennas 21, 31, in comparison to manufacturing legacy antennas. Additionally, the systems and methods disclosed herein can provide for both faster and more cost-effective manufacturing, by utilizing the laser cutting and chemical etching combination, to accelerate the speed of production of said antennas 21, 31.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more embodiments, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "block for."

Reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A method for manufacturing a printed circuit board (PCB) for a wireless power transfer system, the PCB including an antenna, the antenna including a coil, the method comprising:

providing a prefabricated PCB, the prefabricated PCB including a PCB design and a first area;

providing a first sheet of a conductive metal, the first sheet including the first area;

applying an etch resistant coating on a coil area within the first area;

laser cutting the first sheet within the coil area, based on a laser cutting path, the laser cutting path defining a first geometry for a first plurality of turns for a first layer of the coil, the first geometry configured for one or more of transmission of wireless power signals, receipt of wireless power signals, and combinations thereof; and substantially exposing the first sheet to an etching solution, the etching solution substantially removing first portions of the conductive metal from a substrate to define, at least, first turn gaps between at least two of the first plurality of turns.

2. The method of claim 1, further comprising determining the coil area based, at least, on an exterior geometry for the first layer of the coil.

3. The method of claim 1, further comprising determining the laser cutting path based, at least, on one or more of the first geometry, a number of turns for the first plurality of turns, and any combinations thereof.

4. The method of claim 1, wherein the PCB design includes one or more of at least one trace, at least one via, or combinations thereof.

5. The method of claim 4, further comprising providing a pressure sensitive adhesive in between the first sheet and the substrate, and
wherein affixing the first sheet to the substrate includes affixing the first sheet to the substrate via the pressure sensitive adhesive.

6. The method of claim 4, further comprising providing a coverlay substantially covering the first layer of the coil and the substrate.

7. The method of claim 1, further comprising:
providing a second sheet of a conductive metal, the second sheet defining a second area;
applying an etch resistant coating on a second coil area within the second area;
laser cutting the second sheet within the second coil area, based on a second laser cutting path, the second laser cutting path defining a second geometry for a second plurality of turns for a second layer of the coil, the second geometry configured for one or more of transmission of wireless power signals, receipt of wireless power signals, and combinations thereof; and
substantially exposing the second sheet to an etching solution, the etching solution substantially removing second portions of the conductive metal, the second portions positioned to define, at least, turn gaps between at least two of the second plurality of turns.

8. The method of claim 1, wherein the conductive metal is copper.

9. The method of claim 8, wherein the conductive metal is half-ounce copper, and wherein the first geometry defines at least one gap between two of the first plurality of turns is less than about 50 microns.

10. The method of claim 8, wherein the conductive metal is one-ounce copper and wherein the first geometry defines at least one gap between two of the first plurality of turns is less than about 75 microns.

11. The method of claim 8, wherein the conductive metal is two-ounce copper and wherein the first geometry defines at least one gap between two of the first plurality of turns is less than about 100 microns.

12. The method of claim 8, wherein the conductive metal is three-ounce copper and wherein the first geometry defines at least one gap between two of the first plurality of turns is less than about 125 microns.

13. A method for manufacturing a printed circuit board (PCB) for a wireless power transfer system, the PCB including an antenna, the antenna including a multi-layered coil having, at least, a first layer and a second layer, the method comprising:
providing a prefabricated PCB, the prefabricated PCB including a PCB design, a first area, and a second area;
providing a first sheet of a conductive metal, the first sheet including the first area;
providing a second sheet of the conductive metal, the second sheet defining the second area;
applying an etch resistant coating on a first coil area within the first area;
applying an etch resistant coating on a second coil area within the second area;
laser cutting the first sheet within the first coil area, based on a first laser cutting path, the first laser cutting path defining a first geometry for a first plurality of turns for a first layer of the multi-layered coil, the first geometry configured for one or more of transmission of wireless power signals, receipt of wireless power signals, and combinations thereof;
laser cutting the second sheet within the second coil area, based on a second laser cutting path, the second laser cutting path defining a second geometry for a second plurality of turns for a second layer of the multi-layered coil, the second geometry configured for one or more of transmission of wireless power signals, receipt of wireless power signals, and combinations thereof;
substantially exposing the first sheet to an etching solution, the etching solution substantially removing first portions of the conductive metal from a substrate to define, at least, first turn gaps between at least two of the first plurality of turns; and
substantially exposing the second sheet to an etching solution, the etching solution substantially removing second portions of the conductive metal from the substrate to define, at least, second turn gaps between at least two of the second plurality of turns.

14. The method of claim 13, further comprising welding the first layer of the multi-layered coil to the second layer of the multi-layered coil.

15. The method of claim 14, wherein welding the first layer of the multi-layered coil to the second layer of the multi-layered coil includes spot welding the first layer of the multi-layered coil to the second layer of the multi-layered coil at a via.

16. The method of claim 15, wherein the via is configured to connect the first layer of the multi-layered coil to the second layer of the multi-layered coil in a parallel electrical connection.

17. The method of claim 13, further comprising:
affixing the first sheet to a top face of the substrate; and
affixing the second sheet to a bottom face of the substrate.

18. The method of claim 17, further comprising:
providing a first pressure sensitive adhesive in between the first layer and the top face of the substrate; and
providing a second pressure sensitive adhesive in between the second layer and the bottom face of the substrate,
wherein affixing the first sheet to the top face of the substrate includes affixing the first sheet to the top face of the substrate via the first pressure sensitive adhesive, and
wherein affixing the second sheet to the bottom face of the substrate includes affixing the second sheet to the bottom face of the substrate via the second pressure sensitive adhesive.

19. An antenna for a wireless power transfer system, the antenna comprising:
a coil, the coil including a first layer, the first layer defining a first plurality of turns, the first plurality of turns formed by:
providing a prefabricated printed circuit board (PCB), the prefabricated PCB including a PCB design and a first area,
providing a first sheet of a conductive metal, the first sheet including a first area,
applying an etch resistant coating on a coil area within the first area,
laser cutting the first sheet within the coil area, based on a laser cutting path, the laser cutting path defining a first geometry for the first plurality of turns for the first layer of the coil, the first geometry configured for one or more of transmission of wireless power signals, receipt of wireless power signals, and combinations thereof, and substantially exposing the first sheet to an etching solution, the etching solution substantially removing first portions of the conductive metal from a substrate to define, at least, first turn gaps between at least two of the first plurality of turns.

20. The antenna of claim 19, wherein the coil further includes a second layer, the second layer defining a second plurality of turns, the second plurality of turns formed by:

providing a second sheet of a conductive metal, the second sheet defining a second area, applying an etch resistant coating on a second coil area within the second area, laser cutting the second sheet within the second coil area, based on a laser cutting path, the laser cutting path defining a second geometry for the second plurality of turns for the second layer of the coil, the second geometry configured for one or more of transmission of wireless power signals, receipt of wireless power signals, and combinations thereof, substantially exposing the second sheet to an etching solution, the etching solution substantially removing second portions of the conductive metal from the substrate to define, at least, second turn gaps between at least two of the second plurality of turns, wherein the first layer is affixed to a top face of the substrate, and wherein the second layer is affixed to a bottom face of the substrate.

* * * * *